United States Patent
Yasuda et al.

(10) Patent No.: US 9,287,288 B2
(45) Date of Patent: Mar. 15, 2016

(54) SEMICONDUCTOR MEMORY DEVICE

(71) Applicant: Kabushiki Kaisha Toshiba, Minato-ku (JP)

(72) Inventors: Naoki Yasuda, Mie (JP); Yoshiaki Fukuzumi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/479,474

(22) Filed: Sep. 8, 2014

(65) Prior Publication Data
US 2015/0221665 A1 Aug. 6, 2015

(30) Foreign Application Priority Data

Feb. 6, 2014 (JP) ................. 2014-021130

(51) Int. Cl.
*H01L 21/20* (2006.01)
*H01L 27/115* (2006.01)

(52) U.S. Cl.
CPC .... H01L 27/11582 (2013.01); H01L 27/11565 (2013.01)

(58) Field of Classification Search
CPC ............ H01L 27/11582; H01L 29/792; H01L 29/7926; H01L 27/11578; H01L 29/66833; H01L 21/28282; H01L 27/11556; H01L 29/66666
See application file for complete search history.

(56) References Cited

U.S. PATENT DOCUMENTS

| | | | |
|---|---|---|---|
| 6,933,556 B2 | 8/2005 | Endoh et al. | |
| 7,902,591 B2 | 3/2011 | Kito et al. | |
| 8,148,769 B2 | 4/2012 | Kito et al. | |
| 8,293,601 B2 | 10/2012 | Kito et al. | |
| 8,569,133 B2 | 10/2013 | Kito et al. | |
| 2009/0108333 A1* | 4/2009 | Kito | H01L 27/115 257/324 |
| 2010/0072538 A1* | 3/2010 | Kito | H01L 27/11578 257/326 |
| 2010/0187593 A1 | 7/2010 | Morikado | |
| 2012/0008400 A1* | 1/2012 | Fukuzumi | G11C 16/0483 365/185.18 |
| 2013/0032873 A1* | 2/2013 | Kiyotoshi | H01L 27/11582 257/324 |
| 2013/0052803 A1* | 2/2013 | Roizin | H01L 21/28273 438/478 |
| 2013/0161726 A1* | 6/2013 | Kim | H01L 29/792 257/324 |
| 2013/0234233 A1* | 9/2013 | Fujiwara | H01L 29/792 257/324 |

FOREIGN PATENT DOCUMENTS

| | | |
|---|---|---|
| JP | 3957482 B2 | 8/2007 |
| JP | 2009-94214 A | 4/2009 |
| JP | 2010-80561 A | 4/2010 |
| JP | 2010-177279 A | 8/2010 |
| JP | 2013-38124 A | 2/2013 |

* cited by examiner

*Primary Examiner* — Jaehwan Oh
(74) *Attorney, Agent, or Firm* — Oblon, McClelland, Maier & Neustadt, L.L.P.

(57) ABSTRACT

According to one embodiment, a semiconductor memory device includes a stacked body including a plurality of electrode layers and a plurality of insulating layers each provided between adjacent ones of the electrode layers; and a columnar portion penetrating through the stacked body and extending in a stacking direction of the stacked body. The columnar portion includes a channel body extending in the stacking direction; a charge storage film provided between the channel body and the electrode layer; and a gap provided between the charge storage film and the electrode layer.

20 Claims, 20 Drawing Sheets

SEMICONDUCTOR MEMORY DEVICE

CROSS-REFERENCE TO RELATED APPLICATION

This application is based upon and claims the benefit of priority from Japanese Patent Application No. 2014-021130, filed on Feb. 6, 2014; the entire contents of which are incorporated herein by reference.

FIELD

Embodiments described herein relate generally to a semiconductor memory device.

BACKGROUND

A three-dimensional structured memory device is proposed in which a memory hole is formed in a stacked body in which an electrode layer functioning as a control gate in a memory cell is stacked in plural via an insulating layer and a silicon body serving as a channel is provided on the side wall of the memory hole via a charge storage film.

A technology is proposed in which, in a circular cylindrical memory cell of such a three-dimensional structured memory device, the whole or part of a tunnel insulating film is replaced with an air gap in order to suppress leakage current during cell operation. However, since a current passes through the air gap repeatedly during memory cell operation, local dielectric breakdown may occur in this process. Consequently, it may be difficult to ensure the reliability of the memory cell.

DETAILED DESCRIPTION

Figure 1:
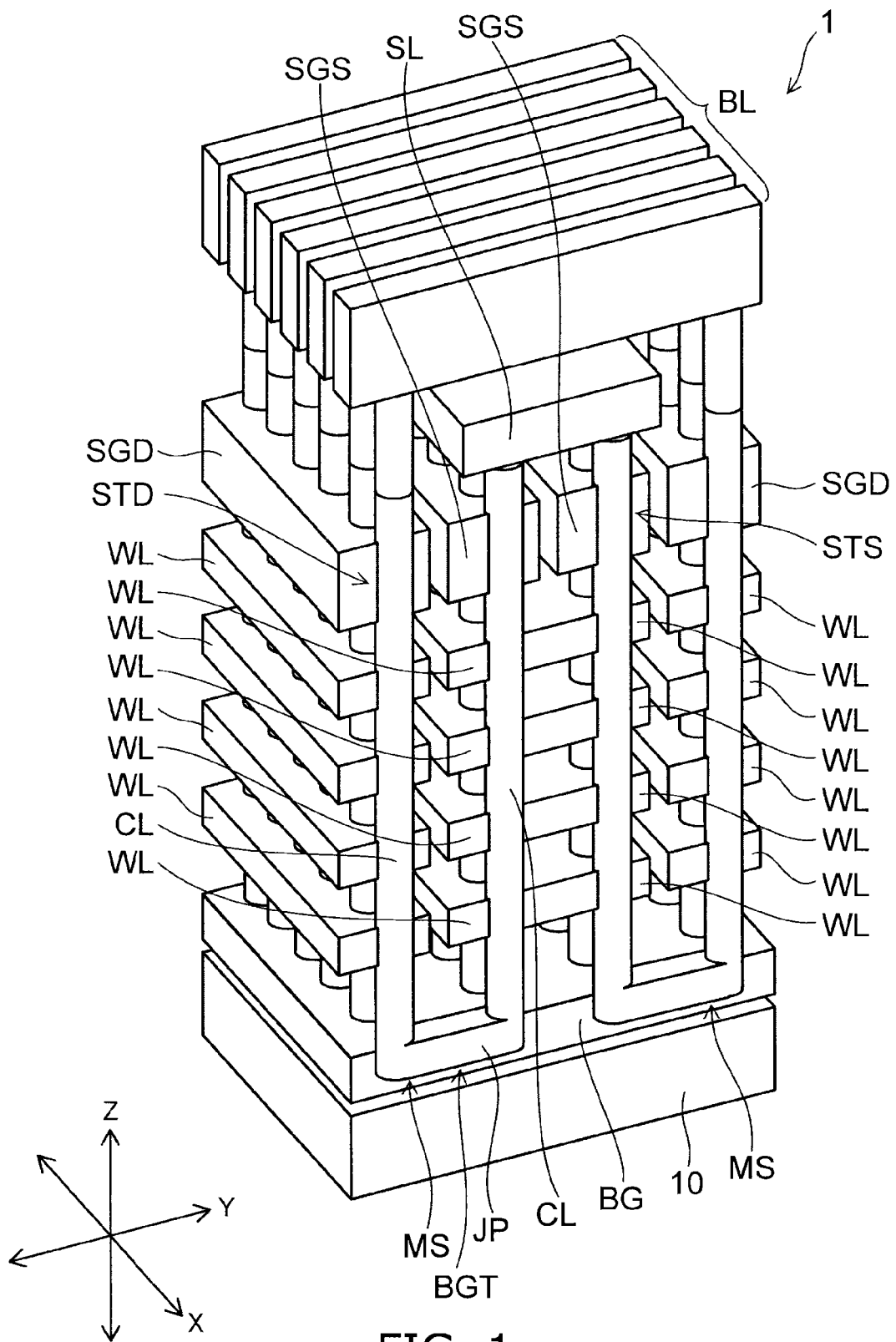
FIG. 1 is a schematic perspective view of a semiconductor memory device of an embodiment.

According to one embodiment, a semiconductor memory device includes a stacked body including a plurality of electrode layers and a plurality of insulating layers each provided between adjacent ones of the electrode layers; and a columnar portion penetrating through the stacked body and extending in a stacking direction of the stacked body. The columnar portion includes a channel body extending in the stacking direction; a charge storage film provided between the channel body and the electrode layer; and a gap provided between the charge storage film and the electrode layer.

Hereinbelow, embodiments are described with reference to the drawings. In the drawings, identical components are marked with the same reference numerals.

FIG. 1 is a schematic perspective view of a memory cell array 1 of a semiconductor memory device of an embodiment. In FIG. 1, the illustration of insulating layers between electrode layers WL, insulating isolation films for separating a stacked body into a plurality of blocks, etc. is omitted for easier viewing of the drawing.

In FIG. 1, two directions parallel to the major surface of a substrate 10 and orthogonal to each other are defined as the X-direction and the Y-direction, and the direction orthogonal to both the X-direction and the Y-direction is defined as the Z-direction (the stacking direction).

The memory cell array 1 includes a plurality of memory strings MS.

Figure 2:
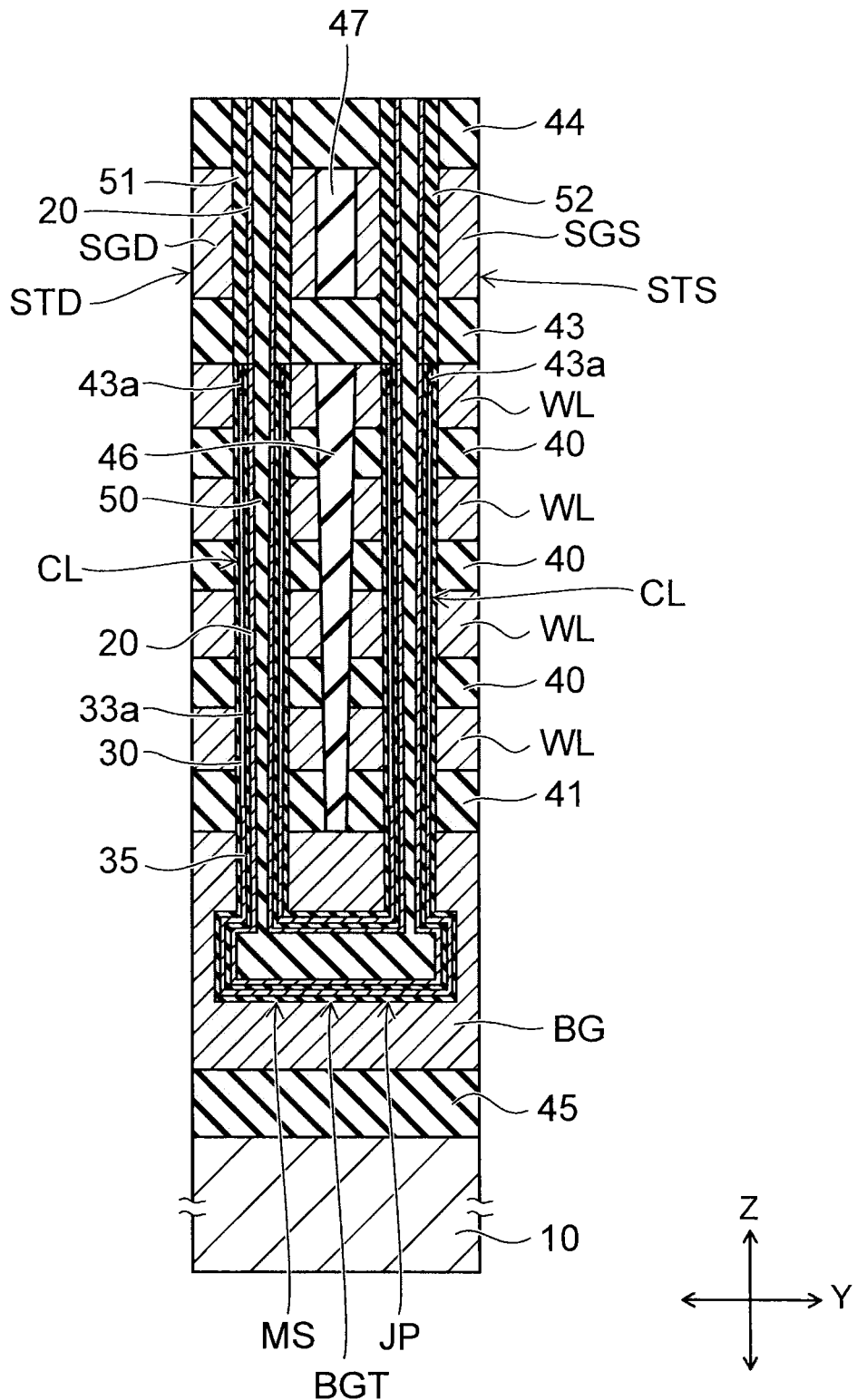
FIG. 2 is a schematic cross-sectional view of the semiconductor memory device of the embodiment.

FIG. 2 is a schematic cross-sectional view of the memory string MS. FIG. 2 shows a cross section parallel to the Y-Z plane in FIG. 1.

The memory cell array 1 includes a stacked body in which an electrode layer WL and an insulating layer 40 are alternately stacked in plural. The stacked body is provided on a back gate BG as a lower gate layer. The number of electrode layers WL shown in the drawing is an example, and the number of electrode layers WL is arbitrary.

The back gate BG is provided on the substrate 10 via an insulating layer 45. The back gate BG and the electrode layer WL are a layer containing silicon as a main component. The back gate BG and the electrode layer WL contain, for example, boron as an impurity for providing the silicon layer with electrical conductivity. The electrode layer WL may contain a metal silicide.

The stacked body including the plurality of electrode layers WL is provided on the back gate BG via an insulating layer 41.

One memory string MS is formed in a U-shaped configuration including a pair of columnar portions CL extending in the Z-direction and a joining portion JP joining the lower ends of the pair of columnar portions CL. The columnar portion CL is formed in a circular columnar shape, for example, and penetrates through the stacked body to reach the back gate BG.

A drain-side select gate SGD is provided at the upper end of one of the pair of columnar portions CL in the U-shaped memory string MS, and a source-side select gate SGS is provided at the upper end of the other. The drain-side select gate SGD and the source-side select gate SGS are provided on the uppermost electrode layer WL via an interlayer insulating layer 43.

The drain-side select gate SGD and the source-side select gate SGS are a layer containing silicon as a main component. The drain-side select gate SGD and the source-side select gate SGS contain, for example, boron as an impurity for providing the silicon layer with electrical conductivity.

The drain-side select gate SGD and the source-side select gate SGS as upper select gates are thicker than one electrode layer WL. The back gate BG as a lower select gate is thicker than one electrode layer WL.

The drain-side select gate SGD and the source-side select gate SGS are separated in the Y-direction by an insulating isolation film 47. The stacked body under the drain-side select gate SGD and the stacked body under the source-side select gate SGS are separated in the Y-direction by an insulating isolation film 46. That is, the stacked body between the pair of columnar portions CL of the memory string MS is separated in the Y-direction by the insulating isolation films 46 and 47.

A source line (for example, a metal film) SL shown in FIG. 1 is provided on the source-side select gate SGS via an insulating layer 44. A plurality of bit lines (for example, metal films) BL shown in FIG. 1 are provided on the drain-side select gate SGD and the source line SL via the insulating layer 44. Each bit line BL extends in the Y-direction.

Figure 3:
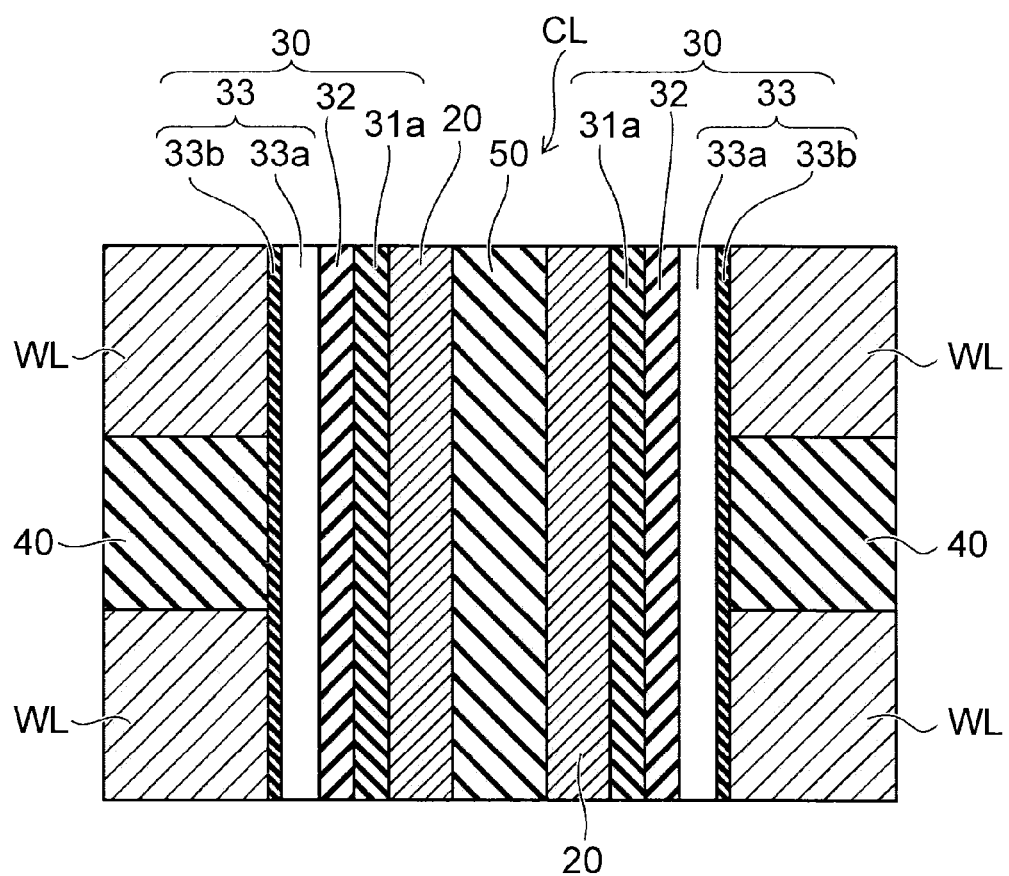
FIG. 3 is a schematic enlarged cross-sectional view of a memory cell of the embodiment.

FIG. 3 is a schematic enlarged cross-sectional view of the columnar portion CL of the memory string MS.

Figure 4A:
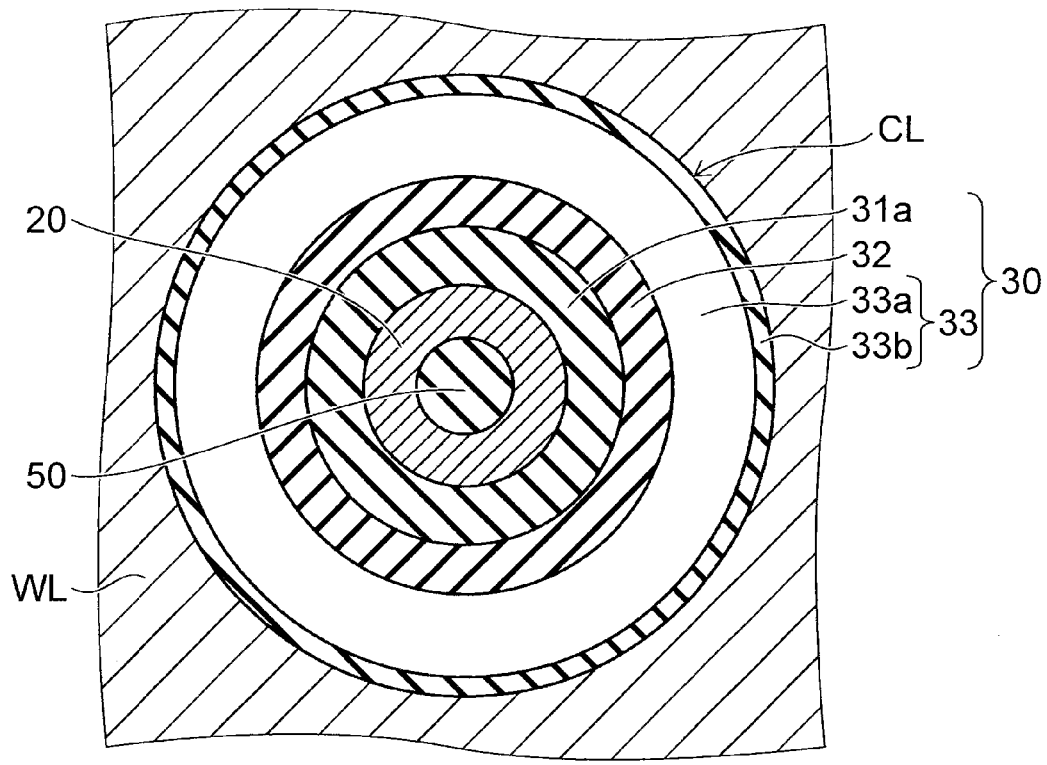
FIG. 4A to FIG. 11B are cross-sectional views of the memory cell of the embodiment.

FIG. 4A is a transverse cross-sectional view of the columnar portion CL and the electrode layer WL surrounding the periphery of it shown in FIG. 3.

Also FIG. 4B to FIG. 11B described later show transverse cross-sectional views of the columnar portion CL similar to FIG. 4A.

The columnar portion CL is formed in a U-shaped memory hole MH shown in FIG. 16 described later. The memory hole MH is formed in the stacked body including the plurality of electrode layers WL, the plurality of insulating layers 40, and the back gate BG.

A channel body 20 as a semiconductor channel is provided in the memory hole MH. The channel body 20 is a silicon film, for example. The impurity concentration of the channel body 20 is lower than the impurity concentration of the electrode layer WL.

A memory film 30 is provided between the inner wall of the memory hole MH and the channel body 20. The memory film 30 includes a block insulating unit 33, a charge storage film 32, and a tunnel insulating film 31a.

The block insulating unit 33, the charge storage film 32, and the tunnel insulating film 31a are provided in this order from the electrode layer WL side between the electrode layer WL and the channel body 20.

The channel body 20 is formed in a cylindrical shape extending in the stacking direction of the stacked body (the Z-direction), and the memory film 30 is provided in a cylindrical shape extending in the stacking direction of the stacked body (the Z-direction) so as to surround the outer peripheral surface of the channel body 20. The electrode layer WL surrounds the periphery of the channel body 20 via the memory film 30. A core insulating film 50 is provided on the inside of the channel body 20. The core insulating film 50 is a silicon oxide film, for example.

The block insulating unit 33 is in contact with the electrode layer WL, the tunnel insulating film 31a is in contact with the channel body 20, and the charge storage film 32 is provided between the block insulating unit 33 and the tunnel insulating film 31a.

The channel body 20 functions as a channel in a memory cell, and the electrode layer WL functions as a control gate of the memory cell. The charge storage film 32 functions as a data storage layer that stores a charge injected from the channel body 20. That is, a memory cell with a structure in which the control gate surrounds the periphery of the channel is formed at the intersection of the channel body 20 and each electrode layer WL.

The semiconductor memory device of the embodiment is a nonvolatile semiconductor memory device that can perform the erasing and writing of data electrically in a free manner and can retain memory content even when the power is turned off.

The memory cell is a charge trap memory cell, for example. The charge storage film 32 includes a large number of trap sites that trap a charge, and is a silicon nitride film ($Si_3N_4$ film), for example.

The tunnel insulating film 31a serves as a potential barrier when a charge is injected from the channel body 20 into the charge storage film 32 or when the charge stored in the charge storage film 32 is diffused into the channel body 20. The tunnel insulating film 31a is a silicon oxide film ($SiO_2$ film), for example.

Alternatively, a stacked film of a structure in which a silicon nitride film is sandwiched by a pair of silicon oxide films (an ONO film) may be used as the tunnel insulating film. By using the ONO film as the tunnel insulating film, the erase operation can be performed in a low electric field as compared to a single layer of a silicon oxide film.

The block insulating unit 33 prevents the charge stored in the charge storage film 32 from diffusing into the electrode layer WL. The block insulating unit 33 includes a cap film 33b and a gap (air gap) 33a provided in this order from the electrode layer WL side.

The gap 33a is in contact with the charge storage film 32, and the cap film 33b is in contact with the electrode layer WL. The gap 33a is provided in a cylindrical shape surrounding the charge storage film 32 and extending in the stacking direction of the stacked body (the Z-direction). The cap film 33b is provided in a cylindrical shape surrounding the gap 33a and extending in the stacking direction of the stacked body (the Z-direction).

The cap film 33b is a film with a higher dielectric constant than silicon oxide, and is a silicon nitride film ($Si_3N_4$ film), for example. By providing the cap film 33b like this in contact with the electrode layer WL, back tunnel electrons injected from the electrode layer WL during erasing can be suppressed. That is, by providing the cap film 33b in addition to the gap 33a, the charge blocking properties of the block insulating unit 33 can be enhanced.

Alternatively, as the cap film 33b, a high-k insulating film such as an aluminum oxide film ($Al_2O_3$ film), a hafnium oxide film ($HfO_2$ film), a hafnium aluminate film (HfAlO film), and a lanthanum aluminate film (LaAlO film) may be used. Alternatively, the cap film 33b may be a stacked film of at least one of an aluminum oxide film, a hafnium oxide film, a hafnium aluminate film, and a lanthanum aluminate film, and a silicon nitride film. The cap film including the high-k insulating film mentioned above enhances the effect of suppressing back tunneling electrons injected from the electrode layer WL during erasing as compared to a cap film of a single layer of a silicon nitride film.

As shown in FIGS. 1 and 2, a drain-side select transistor STD is provided at the upper end of one of the pair of columnar portions CL in the U-shaped memory string MS, and a source-side select transistor STS is provided at the upper end of the other.

The memory cell, the drain-side select transistor STD, and the source-side select transistor STS are a vertical transistor through which a current flows in the stacking direction of the stacked body stacked on the substrate 10 (the Z-direction).

The drain-side select gate SGD functions as the gate electrode (control gate) of the drain-side select transistor STD. An insulating film 51 (FIG. 2) functioning as the gate insulating film of the drain-side select transistor STD is provided between the drain-side select gate SGD and the channel body 20. The channel body 20 of the drain-side select transistor STD is connected to the bit line BL above the drain-side select gate SGD.

The source-side select gate SGS functions as the gate electrode (control gate) of the source-side select transistor STS. An insulating film 52 (see FIG. 2) functioning as the gate insulating film of the source-side select transistor STS is provided between the source-side select gate SGS and the channel body 20. The channel body 20 of the source-side select transistor STS is connected to the source line SL above the source-side select gate SGS.

A back gate transistor BGT is provided in the joining portion JP of the memory string MS. The back gate BG functions as the gate electrode (control gate) of the back gate transistor BGT. The memory film 30 provided in the back gate BG functions as the gate insulating film of the back gate transistor BGT.

A plurality of memory cells using the electrode layers WL as control gates are provided between the drain-side select transistor STD and the back gate transistor BGT. Similarly, a plurality of memory cells using the electrode layers WL as control gates are provided between the back gate transistor BGT and the source-side select transistor STS.

The plurality of memory cells, the drain-side select transistor STD, the back gate transistor BGT, and the source-side select transistor STS are connected in series via the channel body 20 to constitute one U-shaped memory string MS. The memory string MS is arranged in plural in the X-direction and the Y-direction; thus, a plurality of memory cells are provided three-dimensionally in the X-direction, the Y-direction, and the Z-direction.

In the embodiment, the gap 33a is provided in the block insulating unit 33 between the electrode layer WL and the charge storage film 32. During memory cell operation, a tunnel current flows through the tunnel insulating film 31a, but little current flows through the block insulating unit 33. Therefore, it is less likely that local dielectric breakdown will occur in the gap 33a due to current passage.

Since an air gap tunnel insulating film can perform the write operation in a weak electric field, write saturation is less likely to occur; on the other hand, read disturb is likely to occur. Thus, the threshold voltage window cannot be widened. In the circular cylindrical memory cell, since the electric field concentrates more on the central side than on the outer peripheral side in the diameter direction, using an air gap for the tunnel insulating film makes it easier for read disturb current to be increased.

In contrast, the block insulating unit 33 is located in a region near the outer periphery of the circular cylindrical memory cell; therefore, electric field concentration is less likely to occur and leakage current at the time of read disturb can be suppressed. Consequently, a threshold voltage variation due to leakage current is less likely to occur.

Furthermore, by providing the gap 33a with a lower dielectric constant than a silicon oxide film in the block insulating unit 33, the effective oxide thickness (EOT) between the electrode layer WL and the charge storage film 32 is increased, and the electrical distance between the electrode layer WL and the charge storage layer 32 is increased. Therefore, the threshold voltage shift amount accompanying writing and erasing is increased.

Thus, by providing the gap 33a in the block insulating unit 33 between the electrode layer WL and the charge storage film 32, the threshold voltage window can be widened to provide highly reliable memory cell operation.

Next, a method for manufacturing a semiconductor memory device of the embodiment is described with reference to FIG. 13 to FIG. 19.

Figure 13:
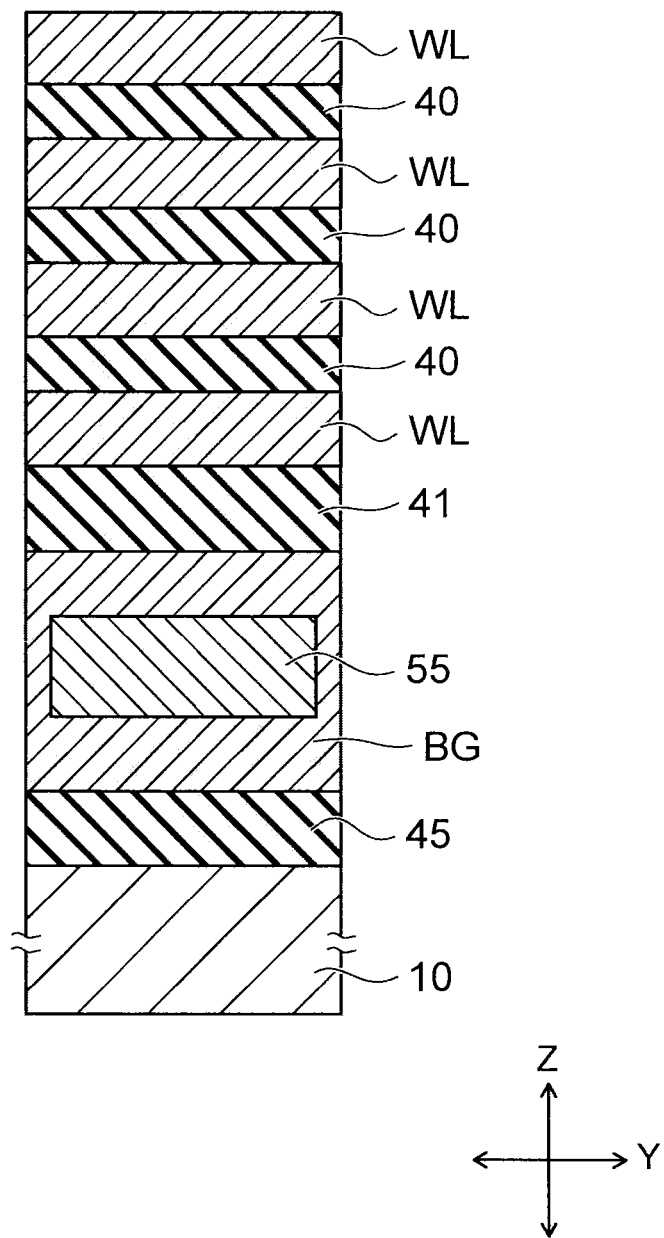
FIG. 13 to FIG. 19 are schematic cross-sectional views showing a method for manufacturing the semiconductor memory device of the embodiment.

As shown in FIG. 13, the back gate BG is formed on the substrate 10 via the insulating layer 45. A recess is formed in the back gate BG, and a sacrifice film 55 is buried in the recess. The sacrifice film 55 is a silicon nitride film, for example.

The insulating layer 41 is formed on the back gate BG. The electrode layer WL and the insulating layer 40 are alternately stacked in plural on the insulating layer 41. The electrode layer WL is a silicon layer containing, for example, boron as an impurity.

Figure 14:
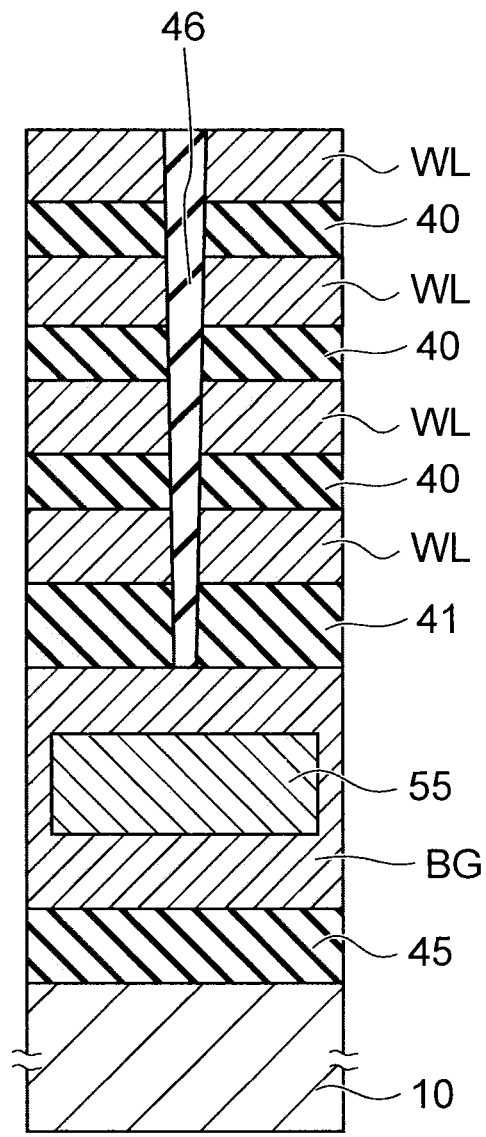

After a stacked body including the electrode layer WL and the insulating layer 40 is formed, a slit is formed in the stacked body. The insulating isolation film 46 is buried in the slit as shown in FIG. 14. The insulating isolation film 46 is a silicon nitride film, for example.

Figure 15:
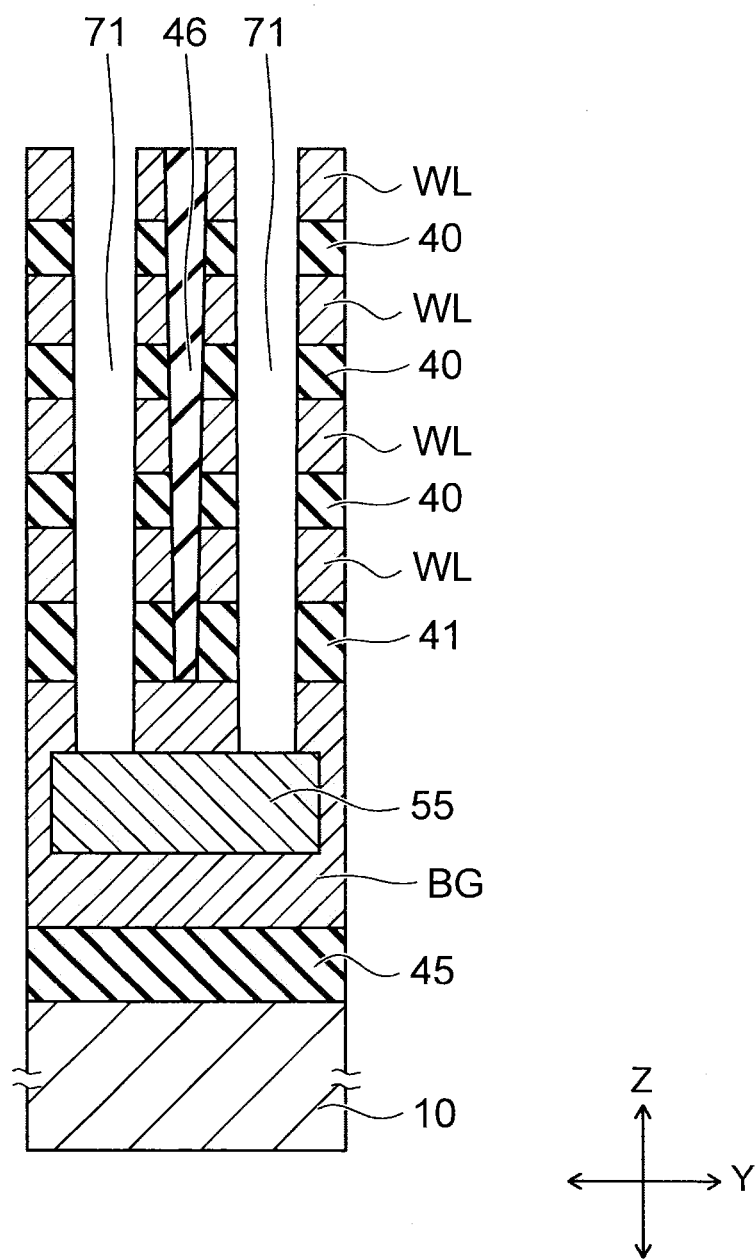

Next, as shown in FIG. 15, a plurality of holes 71 is formed in the stacked body mentioned above. The hole 71 is formed by the RIE (reactive ion etching) method using a not-shown mask, for example.

The lower end of the hole 71 reaches the sacrifice film 55, and the sacrifice film 55 is exposed at the bottom of the hole 71. A pair of holes 71 is formed on one sacrifice film 55.

After the hole 71 is formed, the sacrifice film 55 is removed by etching via the hole 71. The sacrifice film 55 is removed by wet etching, for example.

Figure 16:
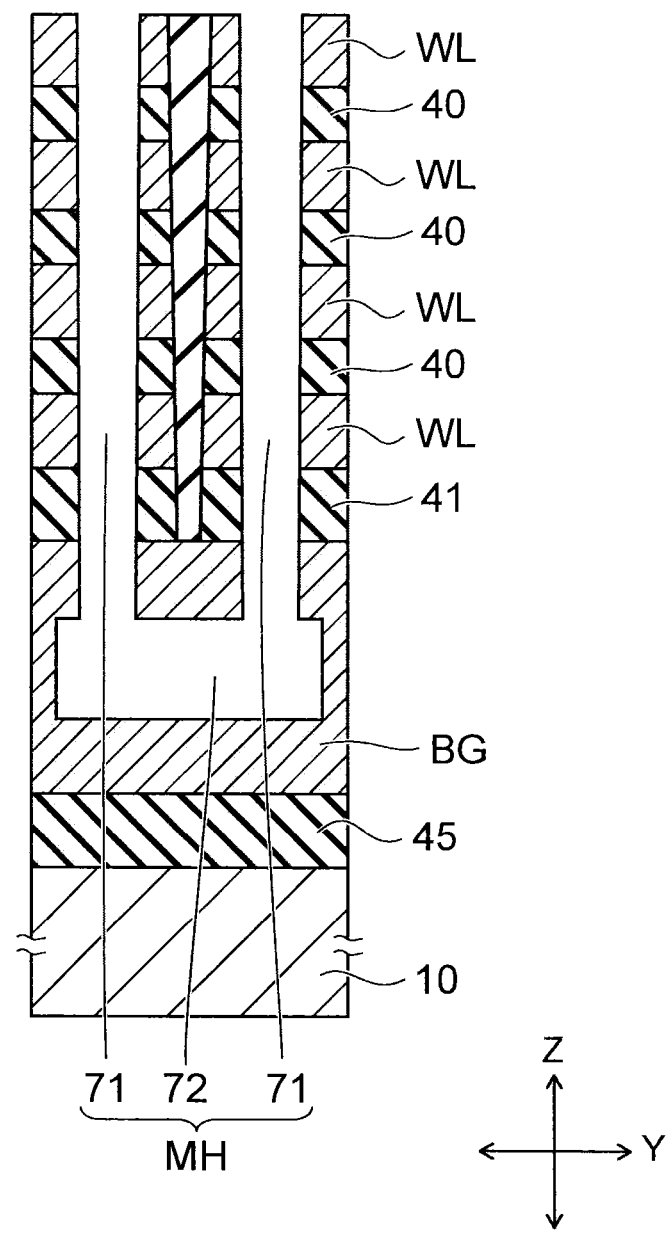

By the removal of the sacrifice film 55, a recess 72 formed in the back gate BG appears as shown in FIG. 16. A pair of holes 71 is joined to one recess 72. That is, the lower ends of a pair of holes 71 are joined to one common recess 72 to form one U-shaped memory hole MH.

Figure 17:
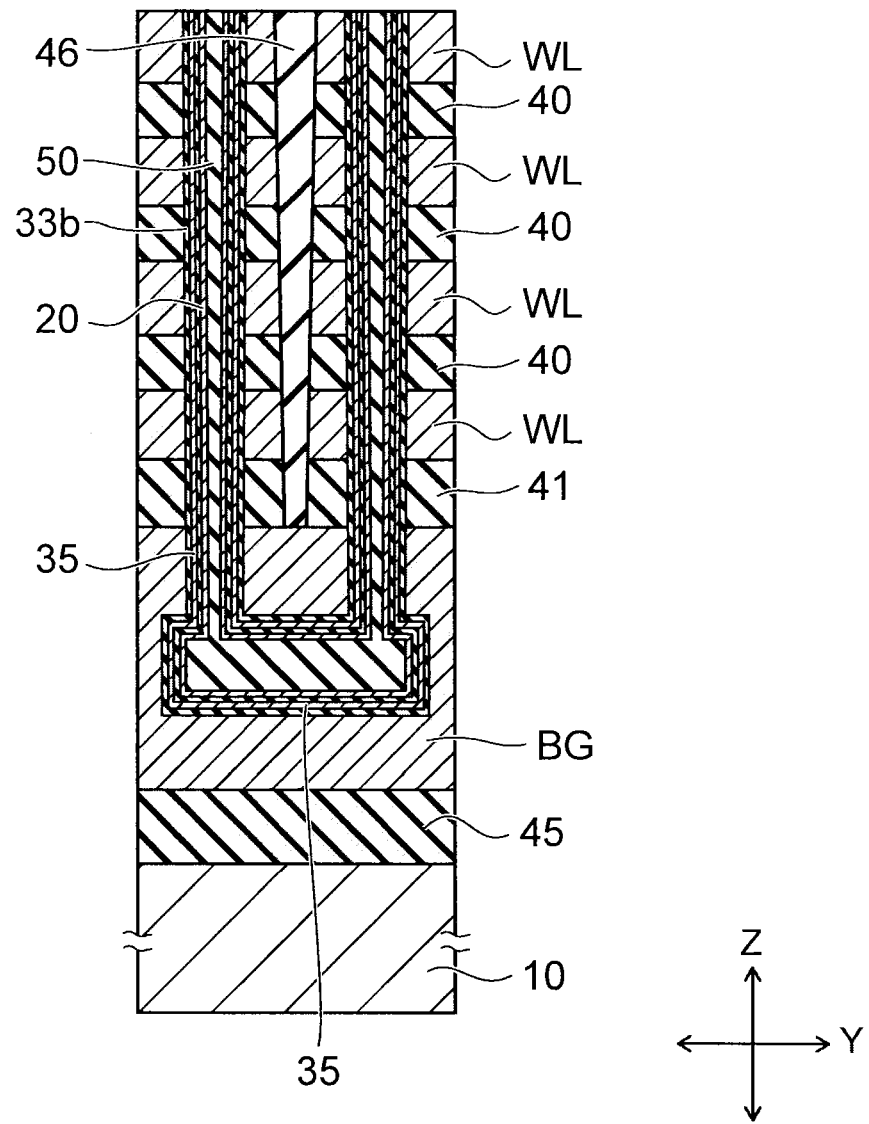

Next, the cap film 33b is formed on the inner wall of the memory hole MH as shown in FIG. 17. Next, a metal film (including a film of a metal compound) 35 is formed on the inner wall of the cap film 33b. The metal film 35 is a film of a different kind from a silicon oxide film, a silicon nitride film, and a silicon oxynitride film, and is a titanium nitride film, for example.

Next, the charge storage film 32 shown in FIG. 3 and FIG. 4A is formed on the inner wall of the metal film 35, the tunnel insulating film 31a is formed on the inner wall of the charge storage film 32, and the channel body 20 is formed on the inner wall of the tunnel insulating film 31a. The core insulating film 50 is buried on the inside of the channel body 20 formed in a cylindrical shape.

Figure 18:
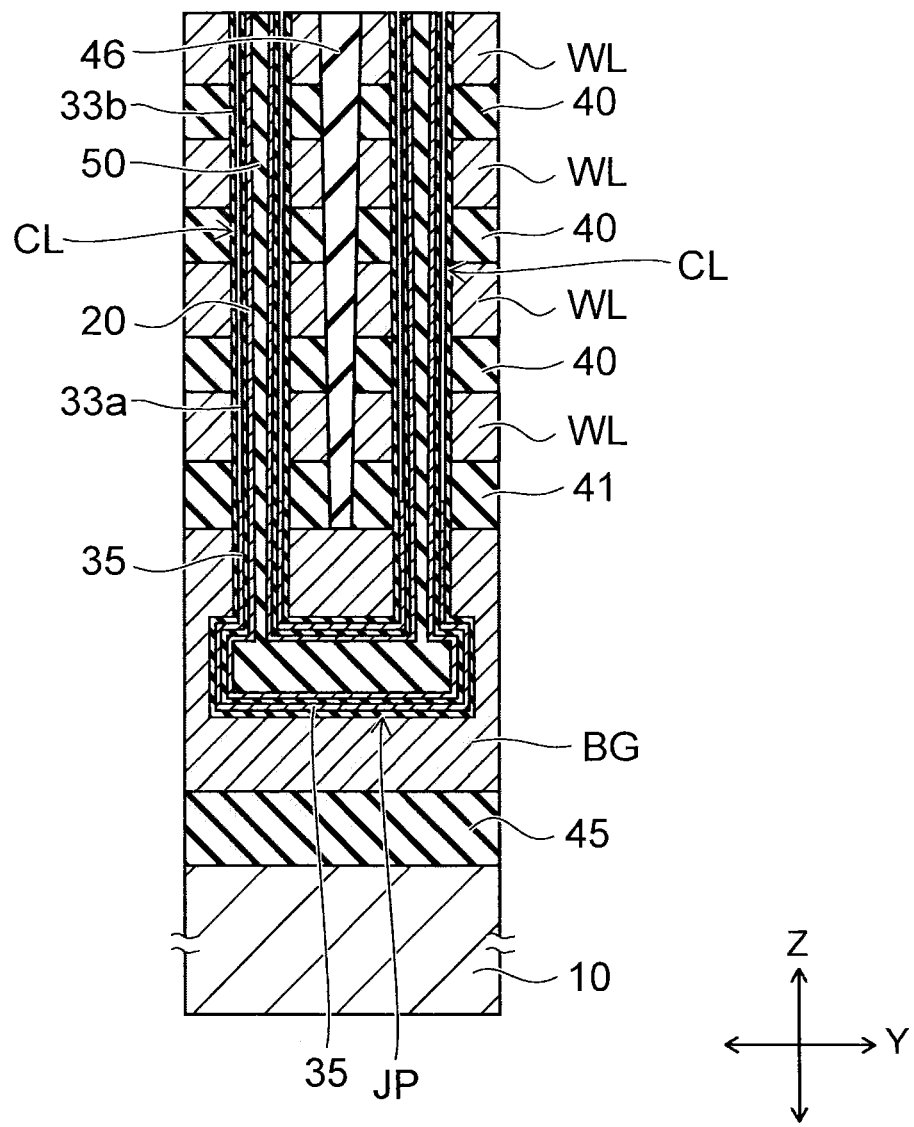

Next, the metal film 35 of a titanium nitride film is wet-etched using an etchant such as sulfuric acid/hydrogen peroxide mixture, for example. The metal film 35 is etched selectively with respect to the cap film 33b and the charge storage film 32, both of which are a silicon nitride film, and as shown in FIG. 18, the upper end of the metal film 35 is recessed to the height of a middle point of the insulating layer 41 under the lowermost electrode layer WL, for example. Thereby, the gap 33a is formed between the cap film 33b and the charge storage film 32 in the stacked body including the plurality of electrode layers WL. The upper end of the metal film 35 is located under the gap 33a in contact with the gap 33a.

The metal film 35 is left in the joining portion JP in the back gate BG. The metal film 35 is left also in a lower end portion of the columnar portion CL. Thus, the films (the charge storage film 32, the tunnel insulating film 31a, the channel body 20, and the core insulating film 50) on the inside of the gap 33a do not become a state of floating in the air but are supported by the portion where the metal film 35 is buried.

Figure 19:
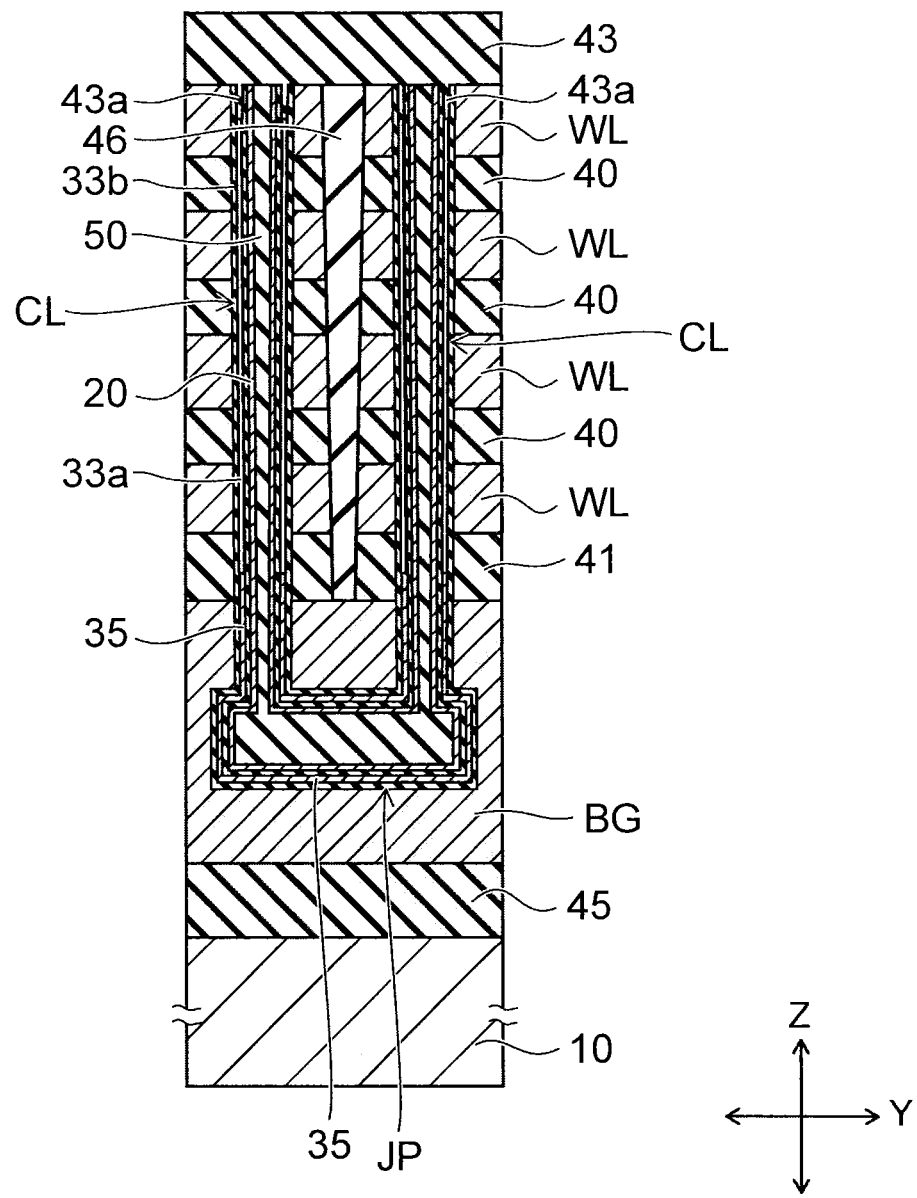

After the gap 33a is formed, the interlayer insulating layer 43 is formed on the uppermost electrode layer WL as shown in FIG. 19.

By the control of the film formation conditions at this time, a part 43a of the interlayer insulating layer 43 enters an upper end portion of the gap 33a. Thus, upper end portions of the films (the charge storage film 32, the tunnel insulating film 31a, the channel body 20, and the core insulating film 50) on the inside of the gap 33a are supported by the part 43a of the interlayer insulating layer 43 from the side surface side.

The structure described above in which the films on the inside of the gap 33a are supported by the metal film 35 and the part 43a of the interlayer insulating layer 43 can be used also for the structures of FIG. 4B to FIG. 11B described later.

An upper select gate that forms the drain-side select gate SGD or the source-side select gate SGS is formed on the insulating layer 43 as shown in FIG. 2, and the insulating layer 44 is formed on the upper select gate. The upper select gate between a pair of columnar portions CL is separated in the Y-direction by the insulating isolation film 47 as shown in FIG. 2.

In the stacked body including the insulating layer 43, the drain-side select gate SGD, the source-side select gate SGS, and the insulating layer 44, a hole is formed in a position corresponding to the columnar portion CL, and the gate insulating films 51 and 52, the channel body 20, and the core insulating film 50 are formed in the hole. The channel body 20 of the drain-side select transistor STD and the source-side select transistor STS is connected to the channel body 20 of the memory cell.

After that, the source line SL, the bit line BL, etc. shown in FIG. 1 are formed on the insulating layer 44.

Figure 4B:
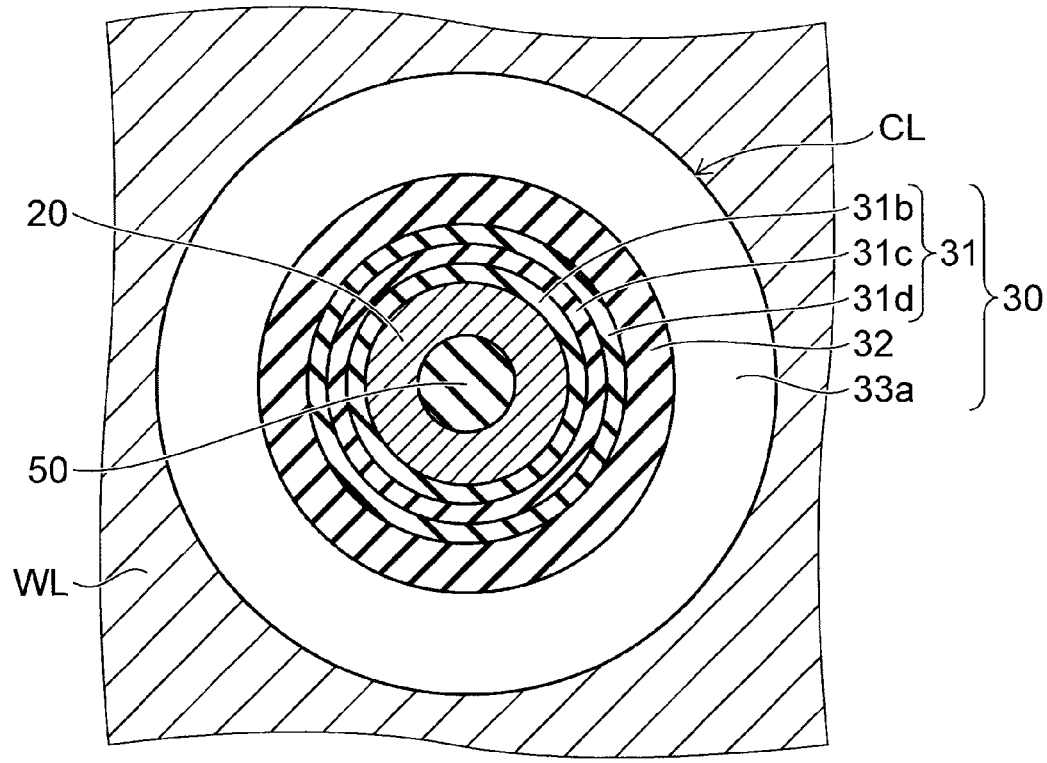

It is also possible to form the block insulating unit out of only the gap 33a as shown in FIG. 4B, not providing the cap film 33b.

In this case, in order to suppress back tunnel electrons injected from the electrode layer WL during erasing, a stacked film of a silicon oxide film 31b, a silicon nitride film 31c, and a silicon oxide film 31d provided in this order from the channel body 20 side (an ONO film) is preferably used as a tunnel insulating film 31 to reduce the electric field during erasing.

Figure 5A:
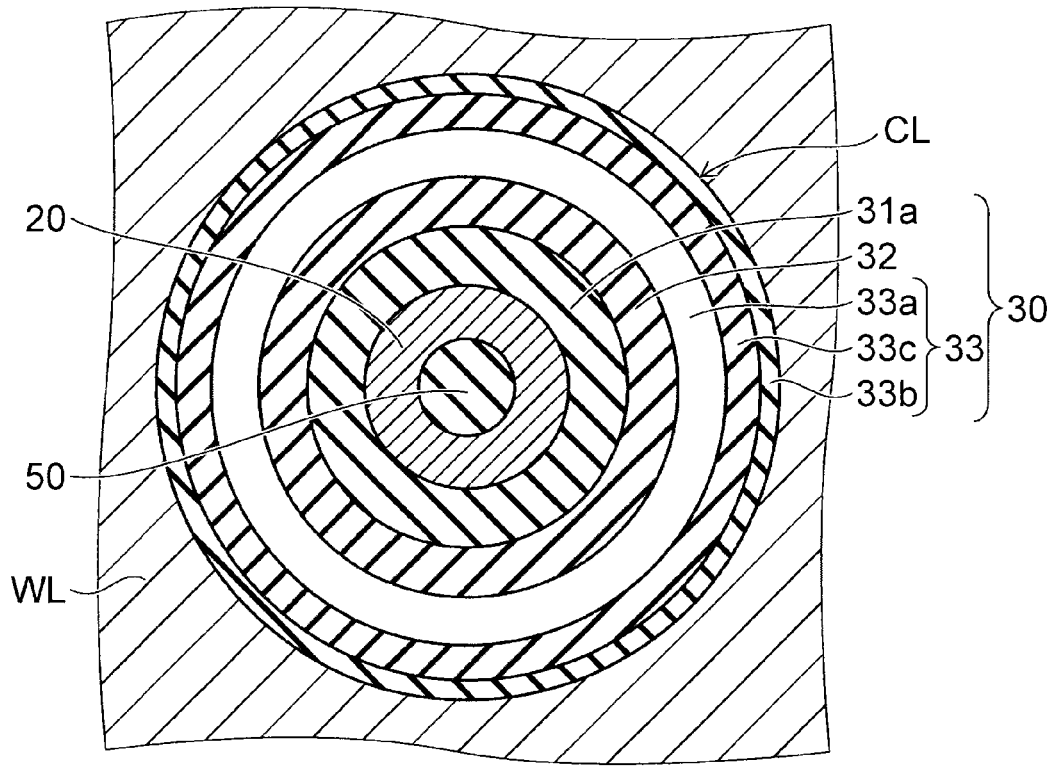

As shown in FIG. 5A, it is also possible to form the block insulating unit 33 out of the cap film 33b, a block insulating film 33c, and the gap 33a provided in this order from the electrode layer WL side.

The outer periphery of the cap film 33b is in contact with the electrode layer WL, and the outer periphery of the block insulating film 33c is in contact with the inner periphery of the cap film 33b.

The block insulating film 33c contains silicon and oxygen, and is a silicon oxide film, for example. Alternatively, the block insulating film 33c may be a silicon oxynitride film.

By disposing the stacked film of the cap film (for example, a silicon nitride film) 33b and the block insulating film (for example, a silicon oxide film) 33c on the electrode layer WL side, back tunnel electrons injected from the electrode layer WL during erasing can be suppressed effectively.

The effective dielectric constant of the block insulating unit 33 may be adjusted between those of $SiO_2$ and air. The voltage necessary for writing and erasing (the voltage applied to the electrode layer WL) can be adjusted by changing the ratio between $SiO_2$ and the gap 33a in the block insulating film 33c.

Figure 5B:
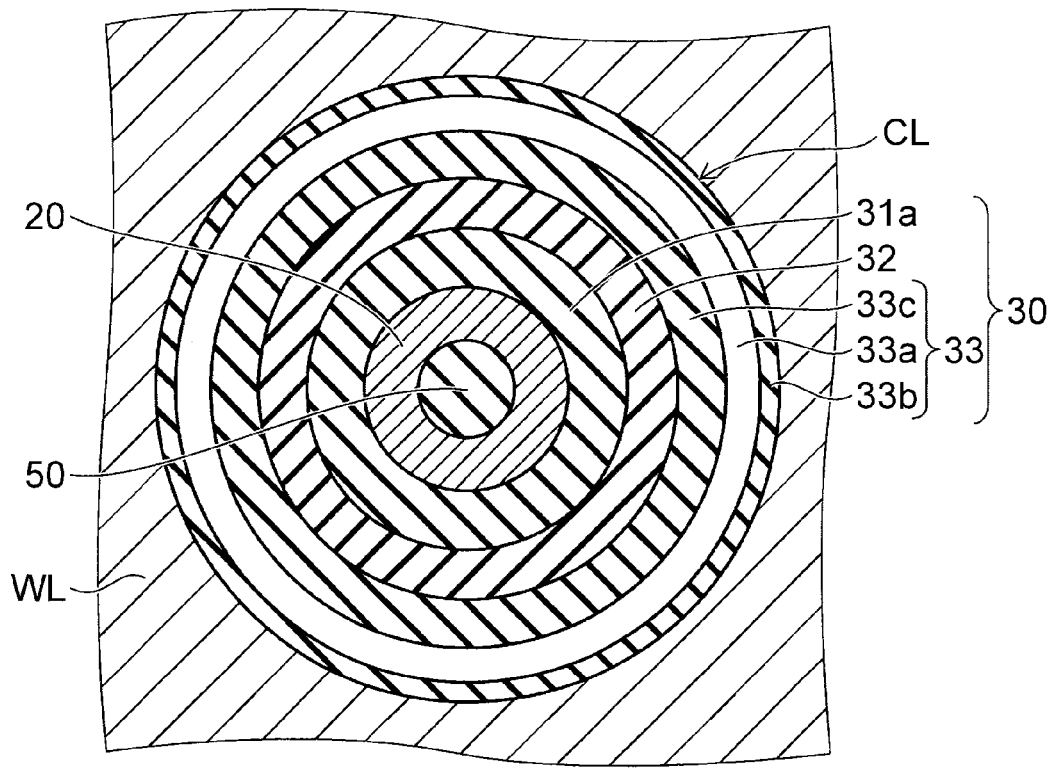

As shown in FIG. 5B, it is also possible to provide the block insulating film 33c in contact with the charge storage film 32. The gap 33a is provided between the block insulating film 33c and the cap film 33b.

The block insulating film 33c of the structure of FIG. 5B suppresses leakage current flowing through the block insulating unit 33 during the write operation.

Figure 6A:
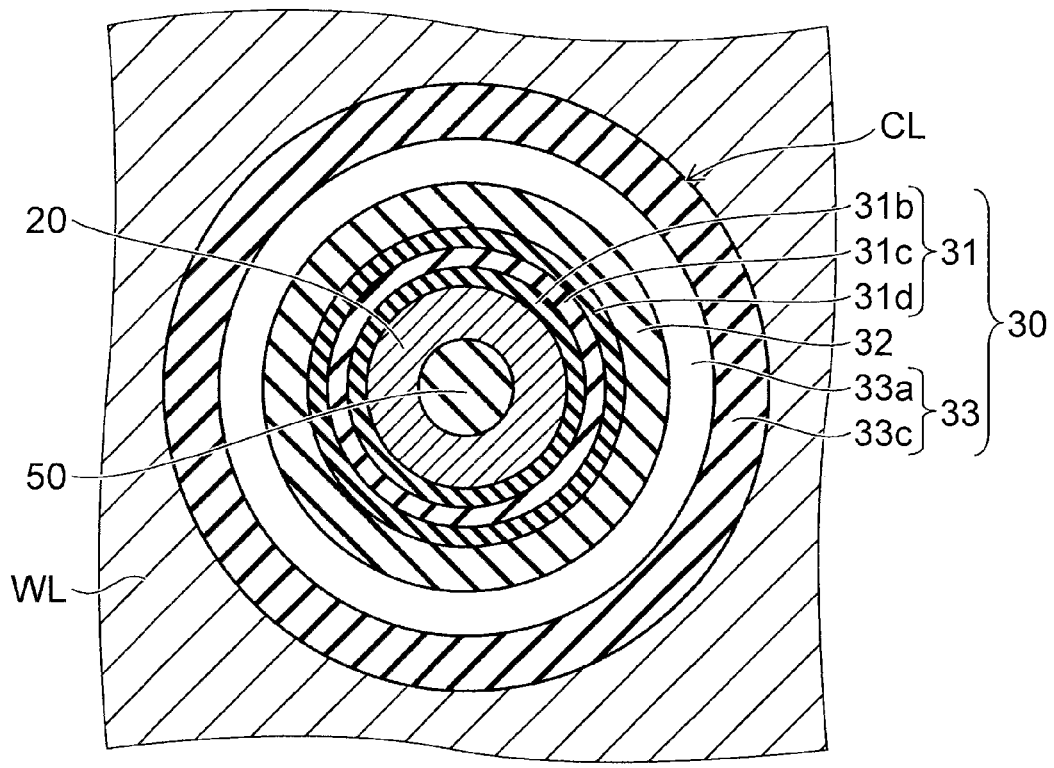

In the structure of FIG. 5A, the cap film 33b may not be provided, and the tunnel insulating film 31a may be replaced with the tunnel insulating film 31 formed of the ONO films 31b to 31d, as shown in FIG. 6A.

Figure 6B:
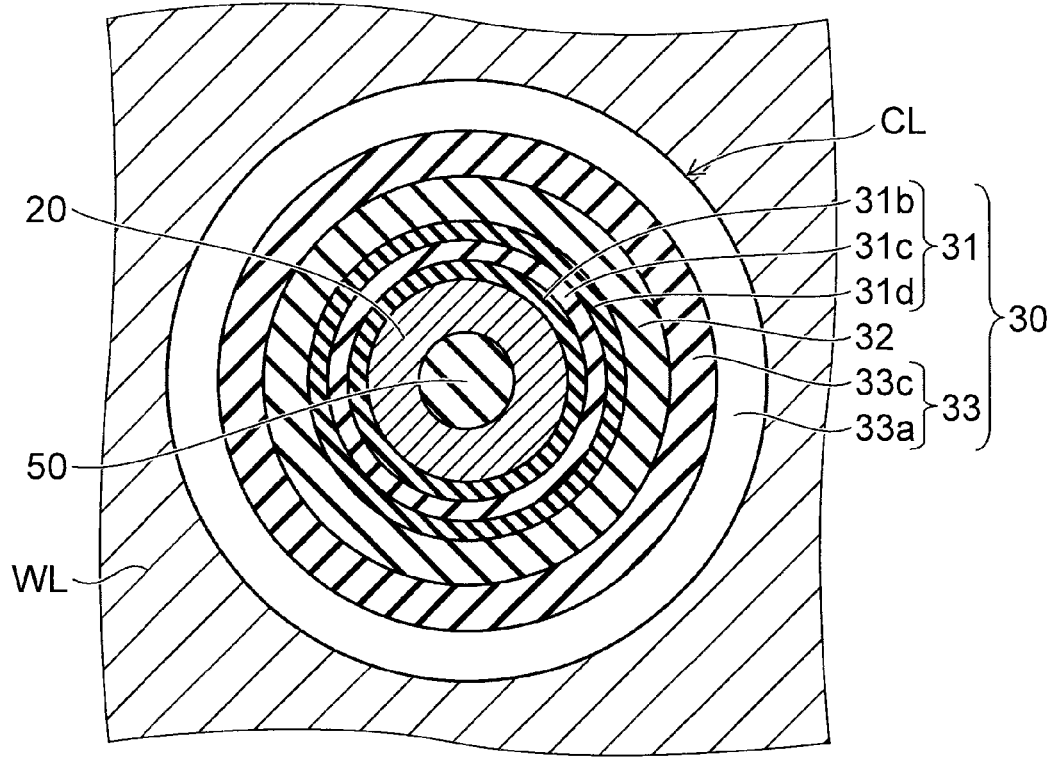

In the structure of FIG. 5B, the cap film 33b may not be provided, and the tunnel insulating film 31a may be replaced with the tunnel insulating film 31 formed of the ONO films 31b to 31d, as shown in FIG. 6B.

Figure 7A:
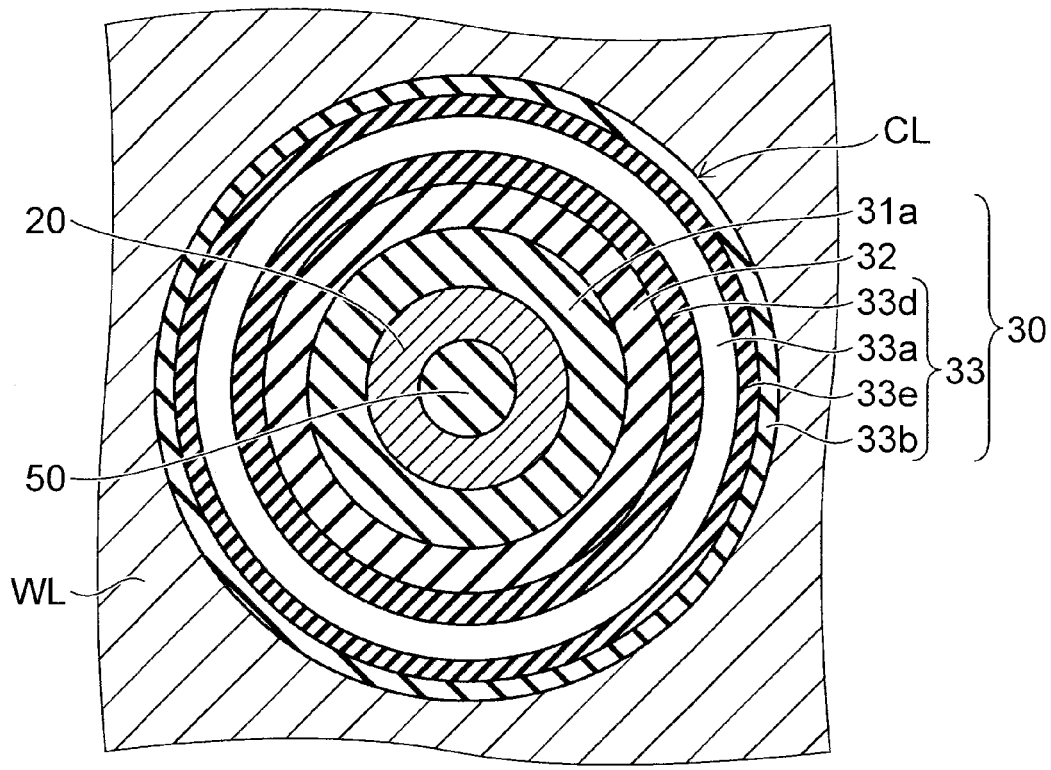

As shown in FIG. 7A, the block insulating unit 33 may be composed of a first block insulating film 33d provided in contact with the outer periphery of the charge storage film 32, the cap film 33b provided in contact with the electrode layer WL, a second block insulating film 33e provided in contact with the inner periphery of the cap film 33b, and the gap 33a provided between the first block insulating film 33d and the second block insulating film 33e.

The first block insulating film 33d and the second block insulating film 33e contain silicon and oxygen, and are a silicon oxide film, for example. Alternatively, the first block insulating film 33d and the second block insulating film 33e may be a silicon oxynitride film.

By providing the block insulating films 33d and 33e on the outer periphery of the charge storage film 32 and on the electrode layer WL side, respectively, leakage current of the block insulating unit 33 during writing and erasing can be suppressed as compared to a structure of only the gap 33a.

The effective dielectric constant of the block insulating unit 33 may be adjusted between those of $SiO_2$ and air. The voltage necessary for writing and erasing (the voltage applied to the electrode layer WL) can be adjusted by changing the ratio between $SiO_2$ and the gap 33a in the block insulating film 33c.

Since the block insulating films (for example, silicon oxide films) 33d and 33e of the same kind are in contact with the gap 33a, the etching process of the metal film 35 described above with reference to FIG. 18 is made easier. That is, in the process of wet processing to remove the metal film 35 of, for example, titanium nitride or the like as a sacrifice film to be replaced with the gap 33a, it is only necessary to consider the selection ratio between the metal film 35 and a silicon oxide film.

Figure 7B:
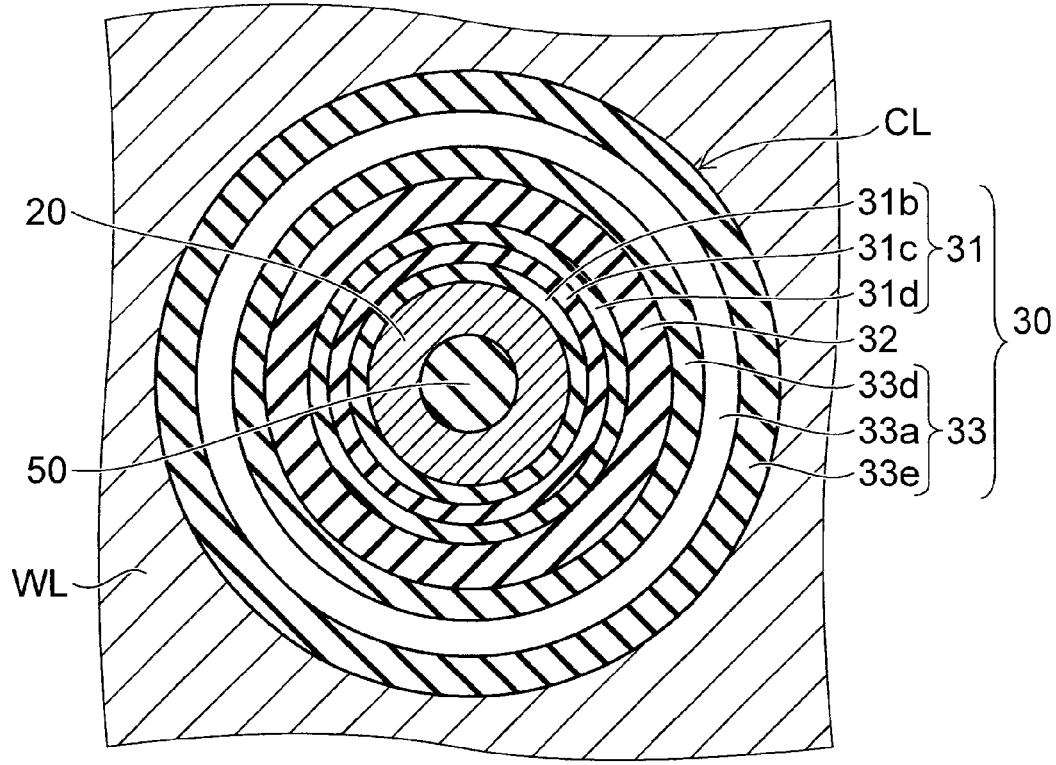

In the structure of FIG. 7A, the cap film 33b may not be provided, and the tunnel insulating film 31a may be replaced with the tunnel insulating film 31 formed of the ONO films 31b to 31d, as shown in FIG. 7B.

Figure 8A:
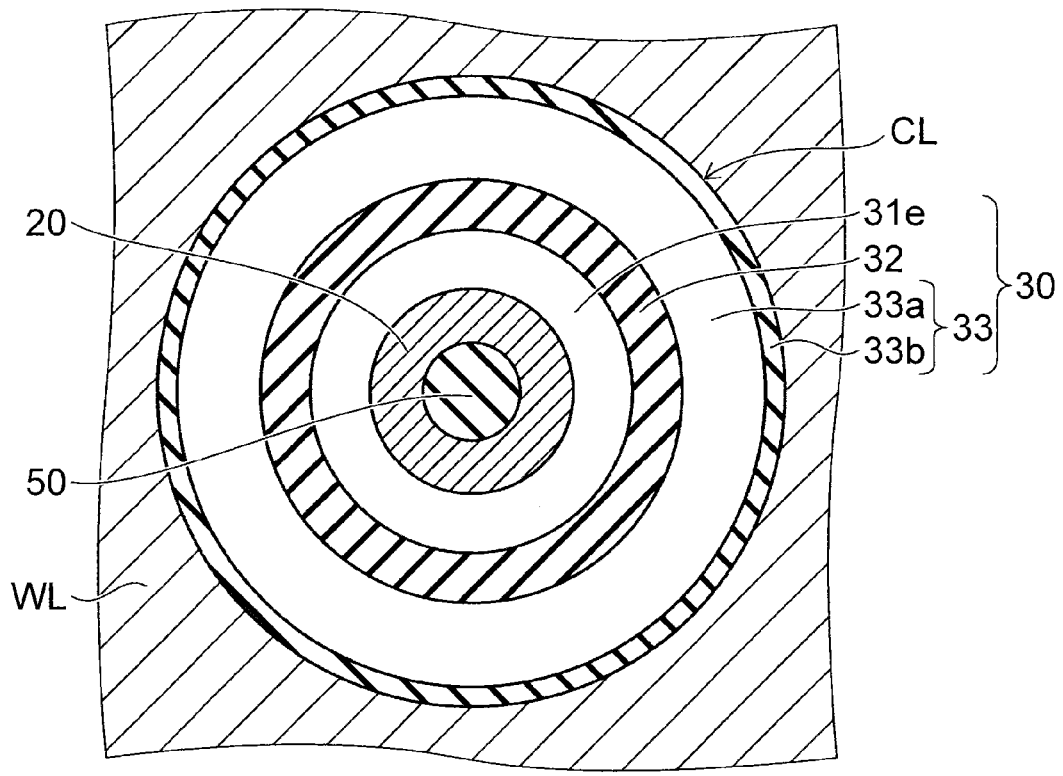

As shown in FIG. 8A, it is also possible to replace the tunnel insulating film with a gap 31e.

Since both the tunnel insulating unit and the block insulating unit include a gap, the coupling ratios between the channel body 20 and the charge storage film 32 and between the charge storage film 32 and the electrode layer WL are well balanced.

It is also possible to use a silicon oxide film or a silicon oxynitride film as part of the tunnel insulating unit to form a stacked structure including this film and the gap 31e.

Also for the gap 31e of the tunnel insulating unit, a structure in which the films on the inside and the outside of the gap 31e are supported by the metal film 35 and the part 43a of the interlayer insulating layer 43 described above may be used.

Figure 8B:
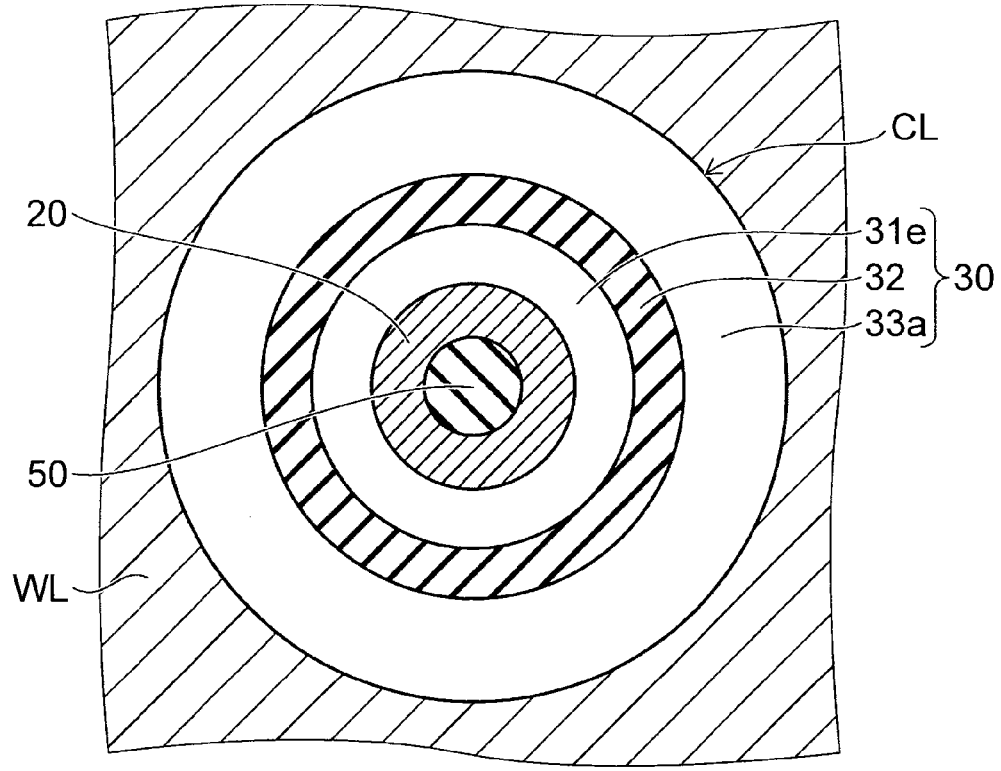

In the structure of FIG. 8A, the cap film 33b may not be provided as shown in FIG. 8B.

Figure 9A:
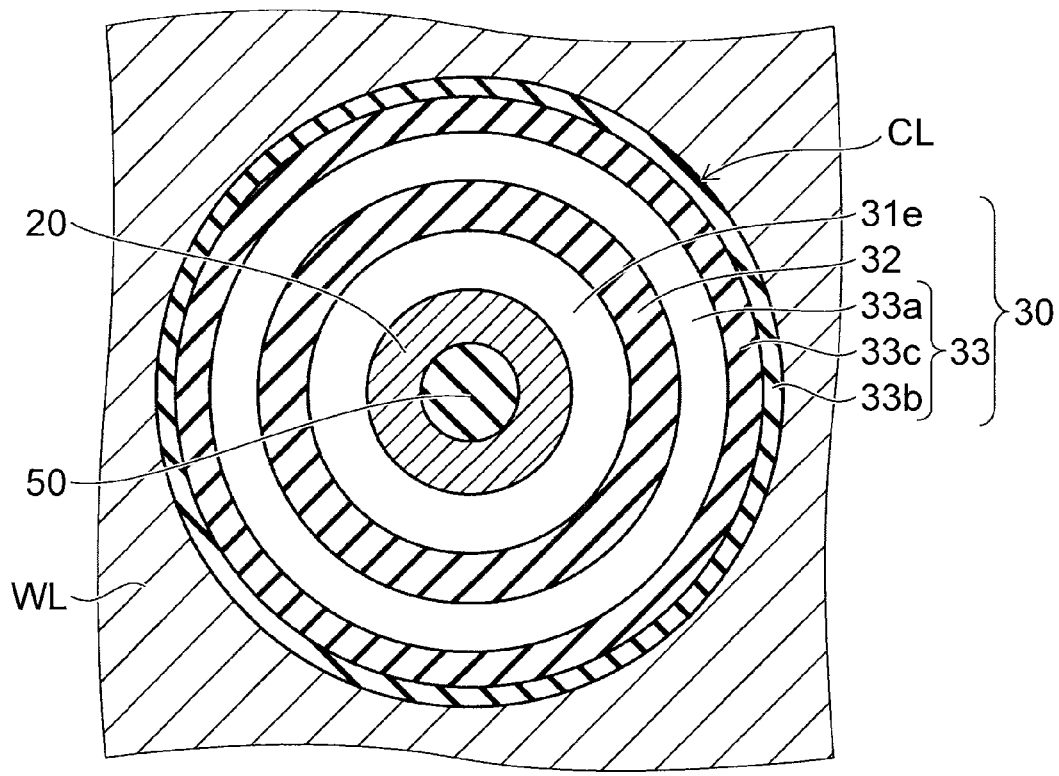

In the structure of FIG. 5A, the tunnel insulating film 31a may be replaced with the gap 31e as shown in FIG. 9A.

Figure 9B:
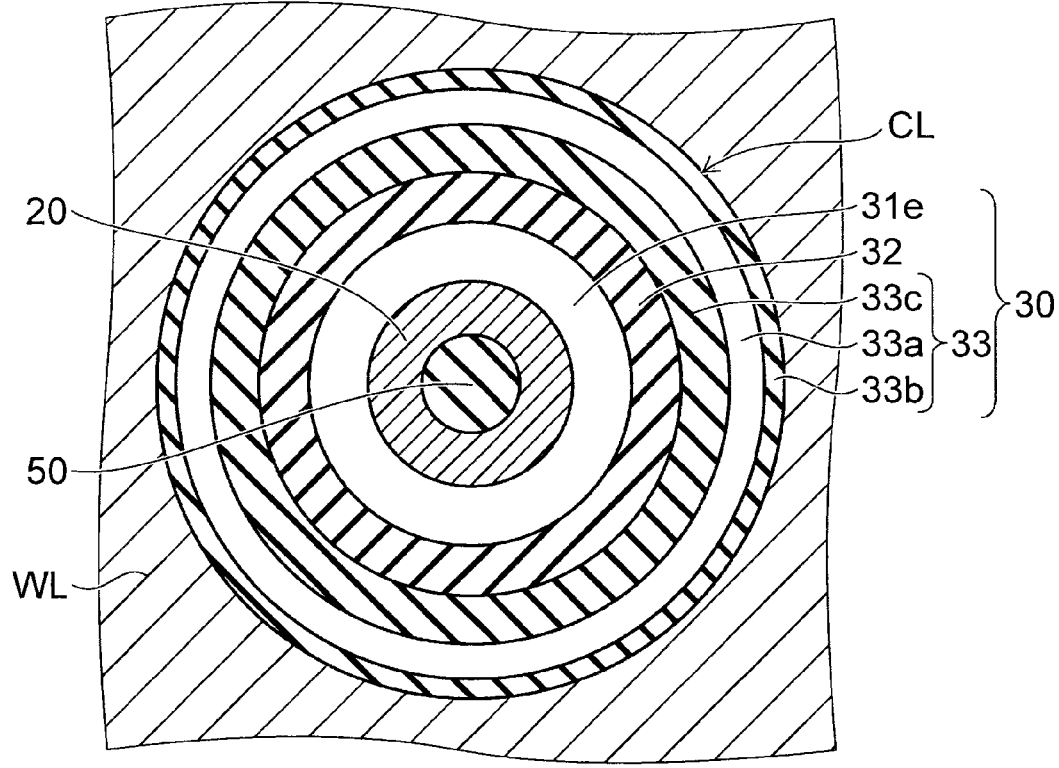

In the structure of FIG. 5B, the tunnel insulating film 31a may be replaced with the gap 31e as shown in FIG. 9B.

Figure 10A:
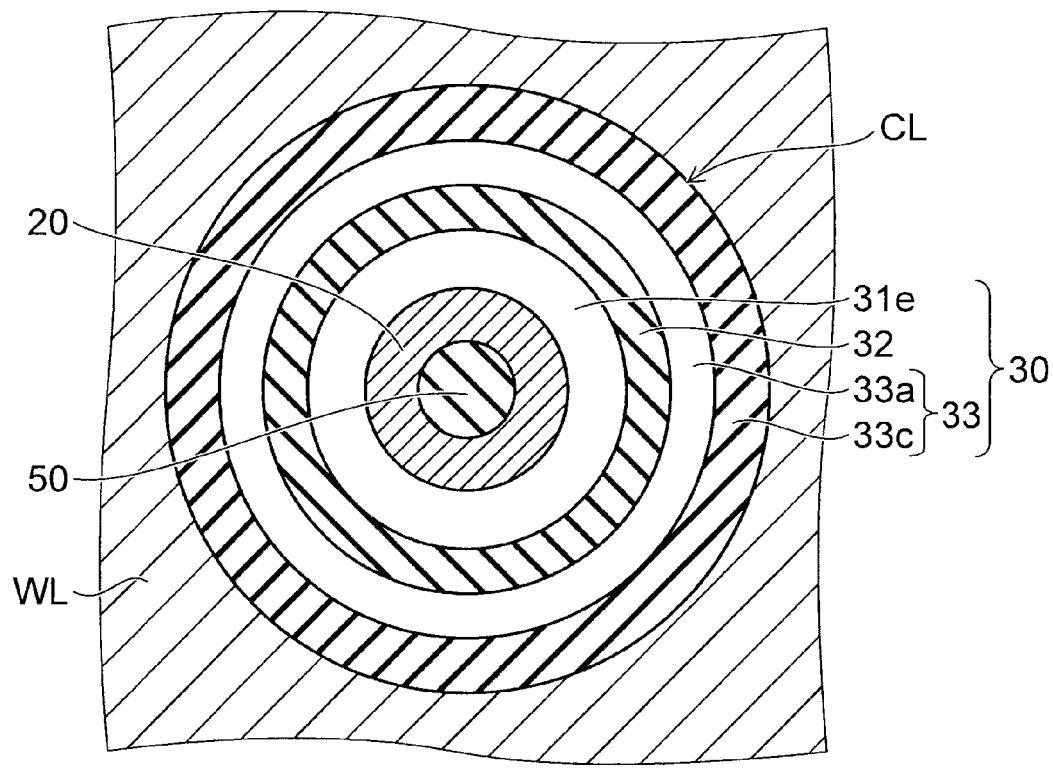

In the structure of FIG. 6A, the tunnel insulating film 31 may be replaced with the gap 31e as shown in FIG. 10A.

Figure 10B:
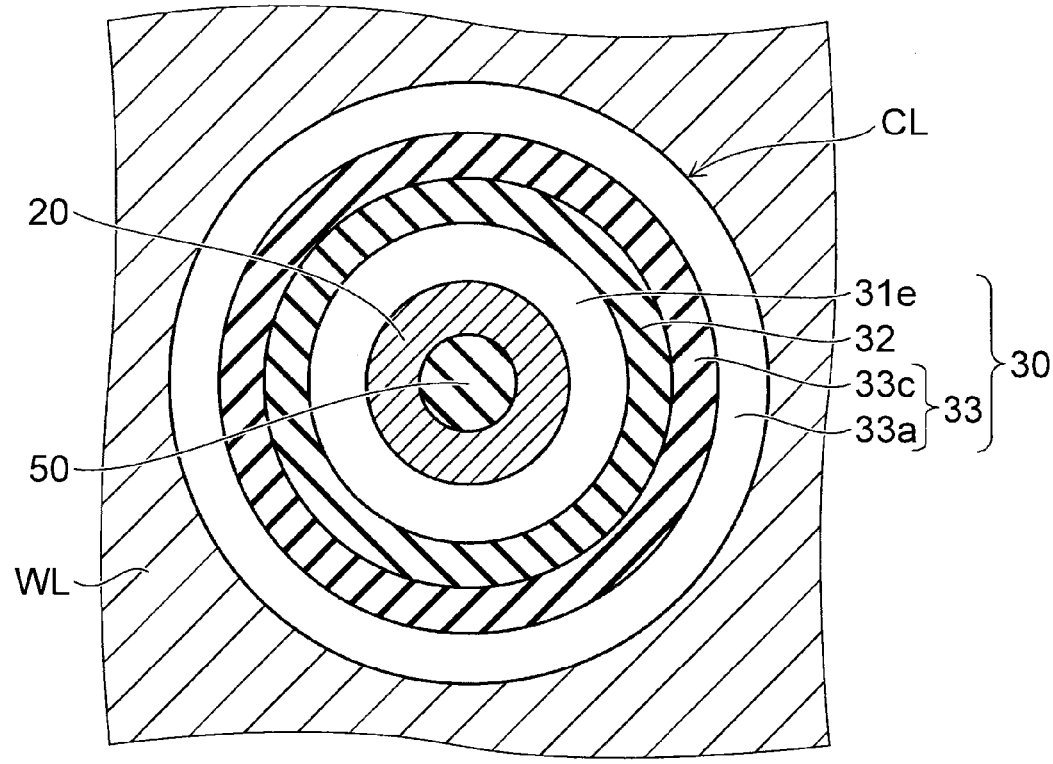

In the structure of FIG. 6B, the tunnel insulating film 31 may be replaced with the gap 31e as shown in FIG. 10B.

Figure 11A:
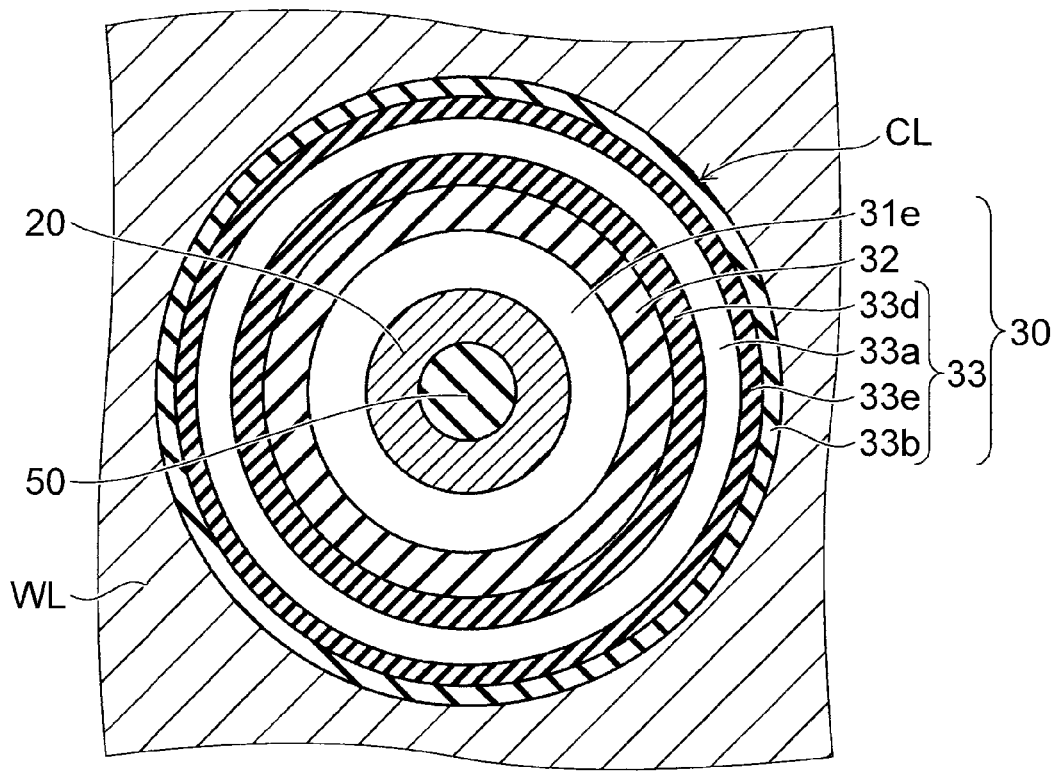

In the structure of FIG. 7A, the tunnel insulating film 31a may be replaced with the gap 31e as shown in FIG. 11A.

Figure 11B:
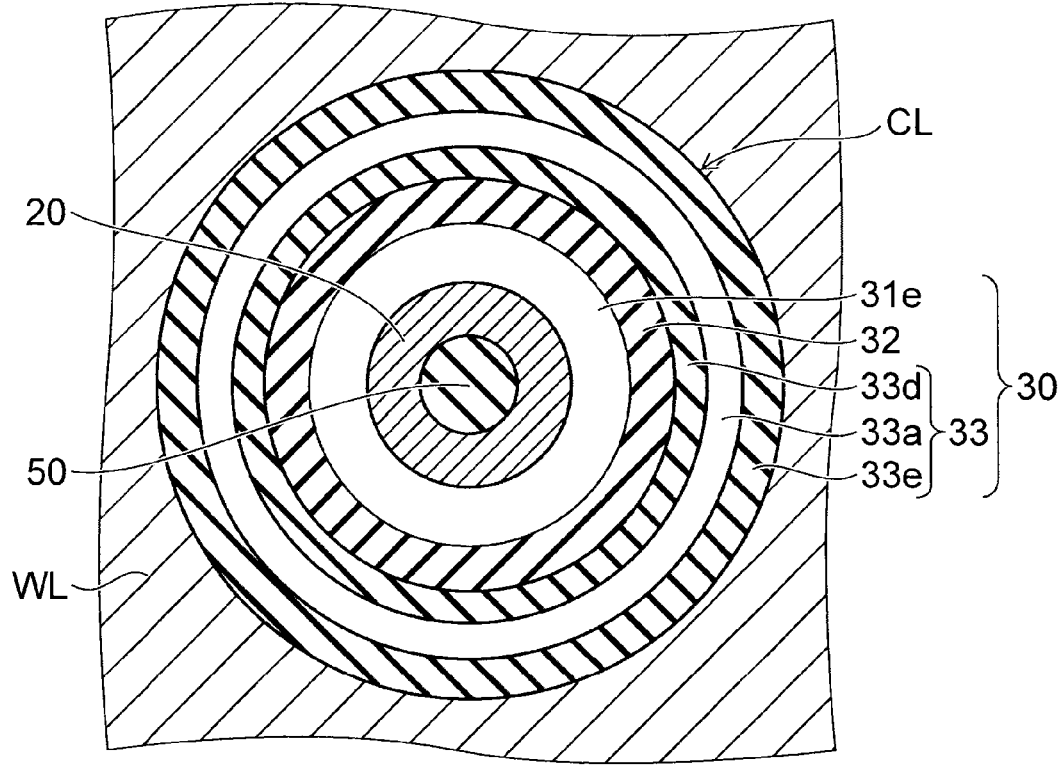

In the structure of FIG. 7B, the tunnel insulating film 31 may be replaced with the gap 31e as shown in FIG. 11B.

Figure 12:
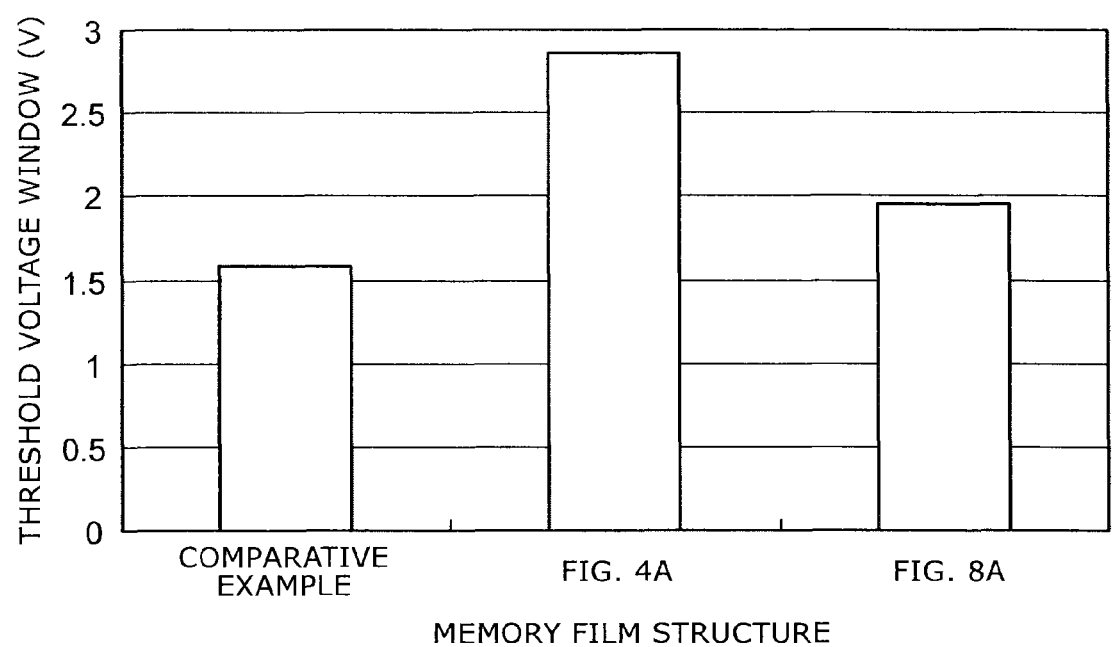
FIG. 12 is a graph showing a simulation result of a threshold voltage window of the embodiment and a comparative example.

FIG. 12 shows comparison results by simulation of the threshold voltage window during memory cell operation for a comparative example, the structure of FIG. 4A, and the structure of FIG. 8A.

In the structure of FIG. 4A, the diameter of the memory hole (the diameter of the columnar portion CL) is set to 50 nm, the film thickness of the channel body 20 that is an amorphous silicon film is set to 4.3 nm, the film thickness of the cap film 33b that is a $Si_3N_4$ film is set to 2.9 nm, the thickness of the gap 33a is set to 4.5 nm, the film thickness of the charge storage film 32 that is a $Si_3N_4$ film is set to 4.2 nm, and the film thickness of the tunnel insulating film 31a that is a $SiO_2$ film is set to 3.5 nm.

In the comparative example, a $SiO_2$ film is provided in place of the gap 33a in the structure of FIG. 4A, and a gap is provided in place of the tunnel insulating film 31a.

In the structure of FIG. 8A, the diameter of the memory hole (the diameter of the columnar portion CL) is set to 50 nm, the film thickness of the channel body 20 that is an amorphous silicon film is set to 4.3 nm, the film thickness of the cap film 33b that is a $Si_3N_4$ film is set to 2.9 nm, the thickness of the gap 33a is set to 4.5 nm, the film thickness of the charge storage film 32 that is a $Si_3N_4$ film is set to 4.2 nm, and the thickness of the gap 31e is set to 3.5 nm.

The threshold voltage window shows the range of threshold voltage usable in actual practice, and is determined from the upper limit of threshold voltage determined by write characteristic saturation and the lower limit of threshold voltage determined by read disturb. The simulation is a simulation in which the variation in memory hole diameter is considered.

It is found that, in both the structure of FIG. 4A and the structure of FIG. 8A of the embodiment, the threshold voltage window is widened as compared to that of the comparative example. In particular, in the structure of FIG. 4A in which a gap is formed only in the block insulating unit, the widening of the threshold voltage window is significant.

As described above, by the embodiment, the threshold voltage window can be widened even when the memory hole diameter is as small as, for example, 50 nm in the circular cylindrical memory cell. Consequently, a highly reliable memory device with a large memory capacity can be obtained.

Figure 20:
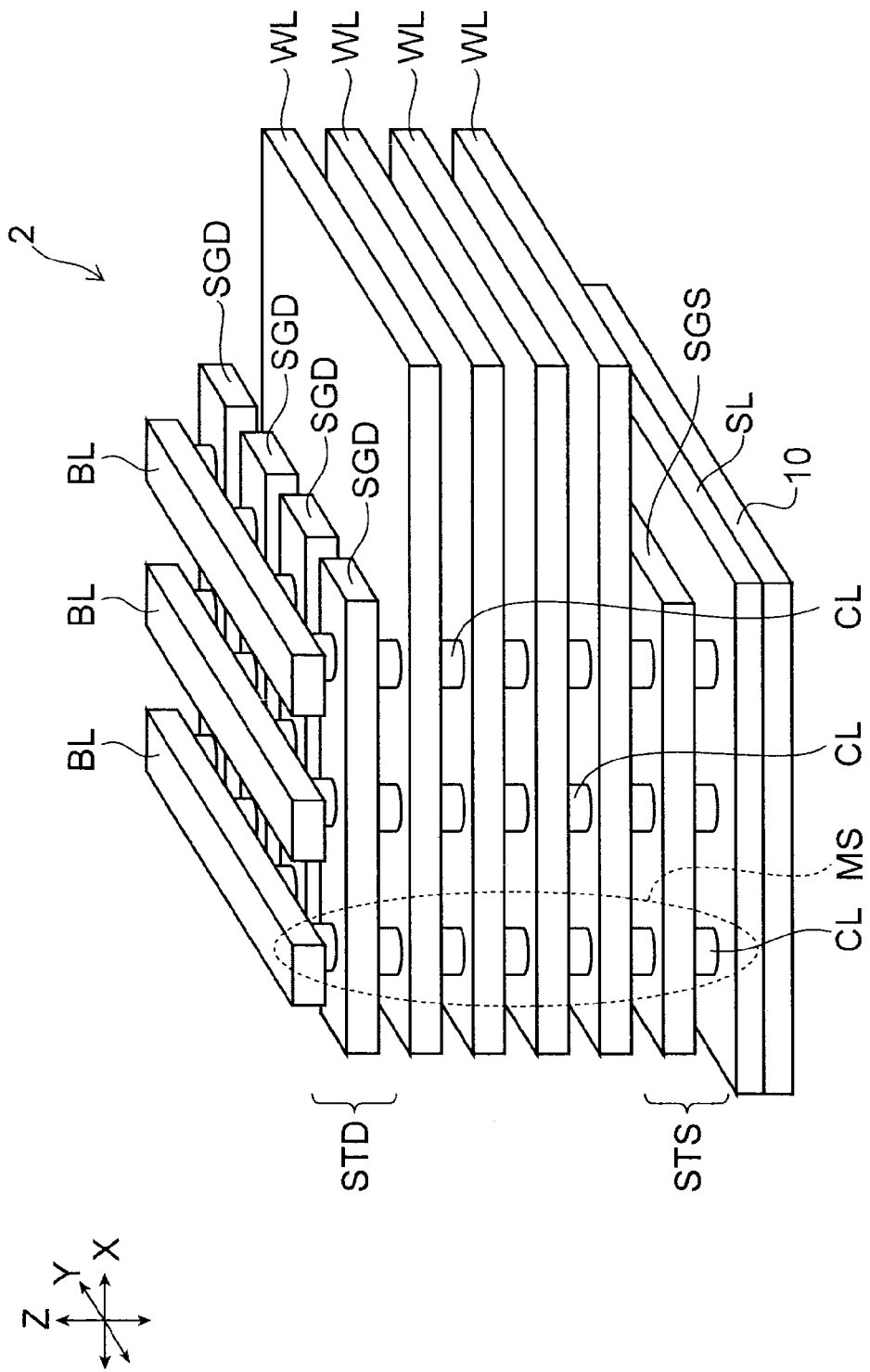
FIG. 20 is a schematic perspective view of another example of the semiconductor memory device of the embodiment.

Next, FIG. 20 is a schematic perspective view of a memory cell array 2 of another example of the semiconductor memory device of the embodiment. Also in FIG. 20, the illustration of insulating layers between electrode layers WL etc. is omitted for easier viewing of the drawing similarly to FIG. 1.

In FIG. 20, two directions parallel to the major surface of the substrate 10 and orthogonal to each other are defined as the X-direction and the Y-direction, and the direction orthogonal to both the X-direction and the Y-direction is defined as the Z-direction (stacking direction).

A source layer SL is provided on the substrate 10. The source-side select gate (lower select gate) SGS is provided on the source layer SL via an insulating layer.

An insulating layer is provided on the source-side select gate SGS, and a stacked body in which a plurality of electrode layers WL and a plurality of insulating layers are alternately stacked is provided on that insulating layer.

An insulating layer is provided on the uppermost electrode layer WL, and the drain-side select gate (upper select gate) SGD is provided on the insulating layer.

The columnar portion CL extending in the Z-direction is provided in the stacked body mentioned above. That is, the columnar portion CL penetrates through the drain-side select gate SGD, the plurality of electrode layers WL, and the source-side select gate SGS. The upper end of the channel body 20 in the columnar portion CL is connected to the bit line BL, and the lower end of the channel body 20 is connected to the source line SL.

Also in the memory cell array 2 shown in FIG. 20, similarly to the embodiment described above, the threshold voltage window can be widened by forming a gap in the block insulating unit of the columnar portion CL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a substrate;
   a stacked body provided above the substrate, the stacked body being including a plurality of electrode layers and a plurality of insulating layers each provided between adjacent ones of the electrode layers; and
   a columnar portion penetrating through the stacked body and extending in a stacking direction of the stacked body,
   the columnar portion including:
   a channel body extending in the stacking direction;
   a charge storage film provided between the channel body and the electrode layer; and
   a gap provided between the charge storage film and the electrode layer and
   a first insulating film provided between the charge storage film and the electrode layer; the insulating film overlapping a part of the electrode layer and a part of the gap when viewed along a first direction parallel to a surface of the substrate.

2. The semiconductor memory device according to claim 1, wherein the first insulating film is provided between the gap and the electrode layer.

3. The semiconductor memory device according to claim 2, wherein the first insulating film contains silicon and oxygen.

4. The semiconductor memory device according to claim 1, wherein the first insulating film is provided between the charge storage film and the gap.

5. The semiconductor memory device according to claim 2, further comprising:
   a second insulating film provided between the charge storage film and the gap, the second insulating film overlapping at least a part of the electrode layer when viewed along the first direction.

6. The semiconductor memory device according to claim 5, wherein the second insulating film comprises at least one of silicon oxide or silicon oxynitride.

7. The semiconductor memory device according to claim 1, further comprising a second gap provided between the charge storage film and the channel body.

8. The semiconductor memory device according to claim 2, wherein the first insulating film is provided directly on the electrode layer, the first insulating film having a higher dielectric constant than silicon oxide.

9. The semiconductor memory device according to claim 1, wherein the charge storage film is provided in a cylindrical shape surrounding the channel body, the charge storage film extends in the stacking direction, the gap is provided in a cylindrical shape surrounding the charge storage film and the gap is extending in the stacking direction.

10. The semiconductor memory device according to claim 1, further comprising an interlayer insulating layer provided on the stacked body,
   a part of the interlayer insulating layer being filled between the charge storage film provided in an upper end portion of the columnar portion and the stacked body, and being located on the gap.

11. The semiconductor memory device according to claim 1, further comprising a tunnel insulating film provided between the charge storage film and the channel body.

12. A semiconductor memory device comprising:
   a stacked body including a plurality of electrode layers alternately stacked with a plurality of insulating layers, the stacked body including a first electrode layer, a first insulating layer, a second electrode layer and a second insulating layer, the second electrode layer being provided on the first insulating layer, the first insulating layer being provided on the first electrode layer, and the first electrode layer being provided on the second insulating layer;
   a columnar portion penetrating through the stacked body and extending in a stacking direction of the stacked body,
   the columnar portion including:
   a channel body extending in the stacking direction;
   a charge storage film provided between the channel body and the electrode layer;
   a gap extending in the stacking direction, the gap being provided between the charge storage film and the electrode layer, the gap being provided along the first insulating layer, first electrode layer, second insulating layer and second electrode layer.

13. The semiconductor memory device according to claim 12, wherein the stacked body further includes a third insulating layer provided on the second electrode layer, the gap being provided along the third insulating layer.

14. The semiconductor memory device according to claim 12, wherein the gap is provided continuously along the plurality of electrode layers and the plurality of insulating layers.

15. The semiconductor memory device according to claim 12, further comprising:
   an additional columnar portion penetrating through the stacked body and extending in the stacking direction,
   the additional columnar portion including:
   an additional channel body extending in the stacking direction;
   an additional charge storage film provided between the additional channel body and the electrode layer; and
   an additional gap extending in the stacking direction, the additional gap being provided between the additional charge storage film and the additional electrode layer, the additional gap being provided along the first insulating layer, first electrode layer and the second insulating layer.

16. The semiconductor memory device according to claim 12, further comprising:
   a block insulating film provided between the gap and the electrode layer, and containing silicon and oxygen.

17. The semiconductor memory device according to claim 12, further comprising:
   a block insulating film provided between the charge storage film and the gap, and containing silicon and oxygen.

18. The semiconductor memory device according to claim 12, further comprising:
   a first block insulating film provided between the gap and the electrode layer, and containing silicon and oxygen,
   a second block insulating film provided between the charge storage film and the gap, and containing silicon and oxygen.

19. The semiconductor memory device according to claim 12, further comprising:
   a second gap provided between the charge storage film and the channel body.

20. The semiconductor memory device according to claim 12, further comprising:
   a cap film provided directly on the electrode layer, the cap film being provided between the gap and the electrode layer, the first cap film having a higher dielectric constant than silicon oxide.

* * * * *